(12) United States Patent
Frolik et al.

(10) Patent No.: US 11,150,618 B2
(45) Date of Patent: Oct. 19, 2021

(54) PACKETIZED ENERGY MANAGEMENT CONTROL SYSTEMS AND METHODS OF USING THE SAME

(71) Applicant: The University of Vermont and State Agricultural College, Burlington, VT (US)

(72) Inventors: Jeffrey Frolik, Essex Junction, VT (US); Paul Hines, Burlington, VT (US); Mads Almassalkhi, South Burlington, VT (US)

(73) Assignee: University of Vermont and State Agricultural College, Burlington, VT (US)

( * ) Notice: Subject to any disclaimer, the term of this patent is extended or adjusted under 35 U.S.C. 154(b) by 229 days.

(21) Appl. No.: 16/421,171

(22) Filed: May 23, 2019

(65) Prior Publication Data

US 2019/0324415 A1  Oct. 24, 2019

Related U.S. Application Data

(63) Continuation-in-part of application No. 15/712,089, filed on Sep. 21, 2017.

(Continued)

(51) Int. Cl.
*G05B 19/042* (2006.01)
*H03H 17/02* (2006.01)
*H02J 13/00* (2006.01)

(52) U.S. Cl.
CPC ............ *G05B 19/042* (2013.01); *H02J 13/00* (2013.01); *H02J 13/0006* (2013.01); *H03H 17/02* (2013.01); *G05B 2219/2639* (2013.01)

(58) Field of Classification Search
CPC .......... G05B 19/042; G05B 2219/2639; H02J 13/00; H02J 13/00034; H02J 13/0006;
(Continued)

(56) References Cited

U.S. PATENT DOCUMENTS

| 5,577,028 A | 11/1996 | Chugo et al. |
| 7,373,222 B1 | 5/2008 | Wright et al. |

(Continued)

FOREIGN PATENT DOCUMENTS

| EP | 2978122 A1 | 1/2016 |
| JP | 2015012727 A | 4/2010 |

(Continued)

OTHER PUBLICATIONS

U.S. Appl. No. 16/352,223, filed Mar. 13, 2019, US2019/0214820A1, Published.

(Continued)

*Primary Examiner* — Kidest Bahta
(74) *Attorney, Agent, or Firm* — Downs Rachlin Martin PLLC

(57) ABSTRACT

Aspects of the present disclosure include anonymous, asynchronous, and randomized control schemes for distributed energy resources (DERs). Such control schemes may include packetized energy management (PEM) control schemes for managing DERs that may provide near-optimal tracking performance under imperfect information and consumer quality of service (QoS) constraints.

38 Claims, 15 Drawing Sheets

Related U.S. Application Data

(60) Provisional application No. 62/397,393, filed on Sep. 21, 2016, provisional application No. 62/675,748, filed on May 23, 2018.

(58) Field of Classification Search
CPC ...... H02J 2310/64; H02J 3/005; H03H 17/02; Y02B 70/30; Y02B 70/3225; Y02B 90/20; Y04S 20/00; Y04S 20/221; Y04S 20/222; Y04S 50/10
See application file for complete search history.

(56) References Cited

U.S. PATENT DOCUMENTS

| | | | |
|---|---|---|---|
| 8,065,099 | B2 | 11/2011 | Gibala et al. |
| 8,352,094 | B2 | 1/2013 | Johnson et al. |
| 10,169,833 | B2 | 1/2019 | Barooah et al. |
| 10,256,631 | B2 | 4/2019 | Frolik et al. |
| 2003/0160595 | A1 | 8/2003 | Provanzana et al. |
| 2008/0034111 | A1 | 2/2008 | Kamath et al. |
| 2009/0157835 | A1 | 6/2009 | Thompson et al. |
| 2009/0193268 | A1* | 7/2009 | Kreiner ............... G06F 11/3062 713/300 |
| 2009/0204268 | A1 | 8/2009 | Eaves |
| 2010/0079009 | A1 | 4/2010 | Hyde et al. |
| 2011/0047552 | A1 | 2/2011 | Mergen et al. |
| 2011/0062787 | A1 | 3/2011 | Pan |
| 2011/0233997 | A1 | 9/2011 | Tajima |
| 2012/0008626 | A1 | 1/2012 | Brederveld et al. |
| 2012/0020237 | A1 | 1/2012 | Tanaka et al. |
| 2012/0074909 | A1 | 3/2012 | Hondo et al. |
| 2012/0169291 | A1 | 7/2012 | Abe et al. |
| 2012/0179596 | A1 | 7/2012 | Mitsumoto et al. |
| 2012/0235646 | A1 | 9/2012 | Lo et al. |
| 2013/0006677 | A1 | 1/2013 | Anglin et al. |
| 2013/0044657 | A1 | 2/2013 | Oh et al. |
| 2013/0166081 | A1 | 6/2013 | Sanders et al. |
| 2013/0182558 | A1 | 7/2013 | Orten et al. |
| 2013/0211609 | A1 | 8/2013 | Edtmair et al. |
| 2013/0234535 | A1 | 9/2013 | Sako et al. |
| 2014/0074307 | A1 | 3/2014 | Matsuyama et al. |
| 2014/0114829 | A1 | 4/2014 | Forbes, Jr. |
| 2014/0117946 | A1 | 5/2014 | Muller et al. |
| 2014/0148962 | A1 | 5/2014 | Venayagamoorthy |
| 2015/0012146 | A1 | 1/2015 | Cherian et al. |
| 2015/0077056 | A1 | 3/2015 | Bridges et al. |
| 2015/0142198 | A1* | 5/2015 | Grebel ................ H02J 3/46 700/295 |
| 2015/0357817 | A1 | 12/2015 | Briel |
| 2015/0380936 | A1* | 12/2015 | Frolik ................ H04L 12/6418 307/112 |
| 2016/0134331 | A1* | 5/2016 | Eaves ................ H04B 3/548 307/1 |
| 2016/0261116 | A1 | 9/2016 | Barooah et al. |
| 2017/0104332 | A1* | 4/2017 | Wenzel ................ G01R 31/392 |
| 2018/0189899 | A1 | 7/2018 | Meyn et al. |
| 2019/0214820 | A1 | 7/2019 | Frolik et al. |

FOREIGN PATENT DOCUMENTS

| | | |
|---|---|---|
| WO | 2014137845 A1 | 9/2014 |
| WO | 2016077813 A1 | 5/2016 |
| WO | 2017004487 A1 | 1/2017 |
| WO | 2018057818 A1 | 3/2018 |

OTHER PUBLICATIONS

Mathieu, Johanna L., "State Estimation and Control of Electric Loads to Manage Real-Time Energy Imbalance." IEEE Transactions on Power Systems, vol. 28, No. 1, Feb. 2013.

Meyn, et al., "Ancillary Service to the Grid Using Intelligent Deferrable Loads." IEEE Transactions on Automatic Control, vol. 60., No. 11, Nov. 2015.

US Department of Energy, Enabling Modernization of the Electric Power System. (Sep. 2015) Quadrennial Technology Review, pp. 51-99.

Zhang et al., "A Packetized Direct Load Control Mechanism for Demand Side Management." 51st IEEE Conference on Decision and Control, Dec. 10-13, 2012.

Zhang et al., "A Novel Packet Switching Framework with Binary Information in Demand Side Management." 52nd IEEE Conference on Decision and Control, Dec. 10-13, 2013.

PCT International Search Report and Written Opinion dated Nov. 27, 2017, in related International Application No. PCT/US2017/052828.

Frolik, J., et al., "Urgency-Driven, Plug-in Electric Vehicle Charging," IEEE: Innovative Smart Grid Technologies (ISGT Europe), 2012 3rd IEEE PES International Conference and Exhibition, Oct. 14-17, 2012.

Hilshey, A.D., et al., "Electric Vehicle Charging: Transformer Impacts and Smart, Decentralized Solutions," IEEE: Power and Energy Society General Meeting, 2012 IEEE, Jul. 22-26, 2012.

Vandael, S., et al., "Decentralized Coordination of Plug-in Hybrid Vehicles for Imbalance Reduction in a Smart Grid," Proceeding AAMAS 11 the 10the International Conference on Autonomous Agents and Multiagent Systems, vol. 2, pp. 803-810, Jan. 1, 2011.

Almassalkhi, M., et al., "Packetized Energy Management: Asynchronous and Anonymous Coordination of Thermostatically Controlled Loads," IEEE: 2017 American Control Conference (ACC), May 24-26, 2017.

\* cited by examiner

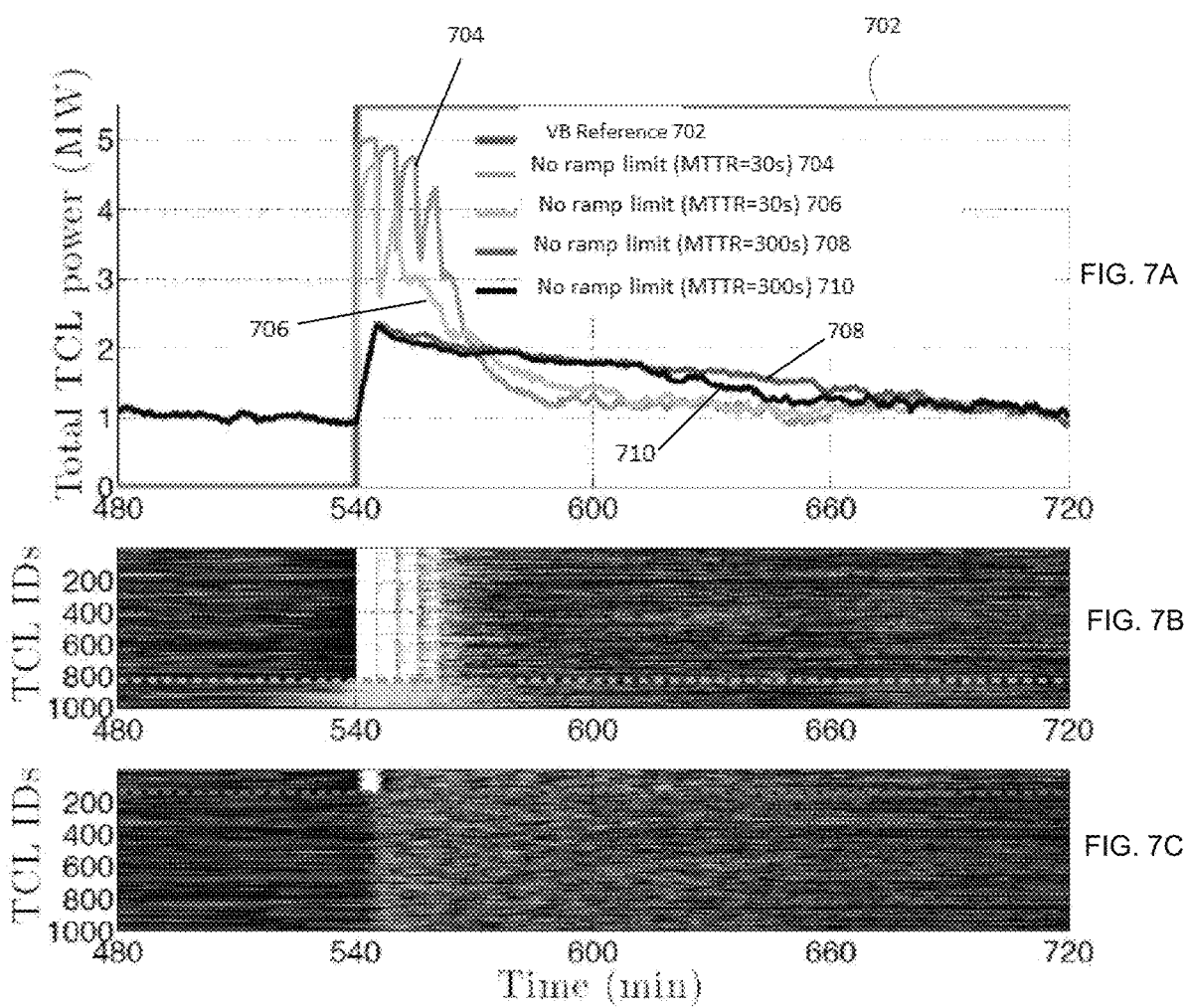

PACKETIZED ENERGY MANAGEMENT CONTROL SYSTEMS AND METHODS OF USING THE SAME

RELATED APPLICATION DATA

This application is a continuation-in-part of U.S. patent application Ser. No. 15/712,089, filed Sep. 21, 2017, and titled "Systems and Methods for Randomized, Packet-Based Power Management of Conditionally-Controlled Loads and Bi-Directional Distributed Energy Storage Systems," now pending, which application claims the benefit of priority of U.S. Provisional Patent Application Ser. No. 62/397,393, filed Sep. 21, 2016, and titled "Systems and Methods for Random-Access Power Management of Thermostatically-Controlled Loads and Bi-Directional Electric Energy Systems." This application also claims the benefit of priority of U.S. Provisional Patent Application Ser. No. 62/675,748, filed May 23, 2018, and titled "Systems And Methods For Packetized Energy Management: Asynchronous and Anonymous Coordination of Thermostatically Controlled Loads." Each of these applications are incorporated by reference herein in its entirety.

STATEMENT REGARDING FEDERALLY SPONSORED RESEARCH

This invention was made with government support under contract nos. ECCS-1254549 and CNS-1735513 awarded by the National Science Foundation, and DE-AR0000694, awarded by the Department of Energy. The government has certain rights in the invention.

FIELD OF THE INVENTION

The present disclosure relates to the management of distributed energy resources.

BACKGROUND

Fast-ramping generators have long provided reliable operating reserves for power systems. However, power systems with high penetrations of renewable energy challenge this operating paradigm. At high levels of renewable penetration, current approaches to deal with the variability in wind or solar generation would require having more fast-ramping conventional generators online. However, that leads to more generators idling, burning fuel, and increasing harmful air-emissions, which all oppose the goals of a "green" energy future. Therefore, there is a need to move away from using such technologies to provide operating reserves, and to consider an active role for flexible and controllable net-load energy resources, e.g., plug-in electric vehicles (PEVs), thermostatically-controlled loads (TCLs), distributed energy storage systems (DESSs), and distributed generation at the consumer level.

SUMMARY OF THE DISCLOSURE

In one implementation, the present disclosure is directed to a method of providing ancillary services to a power grid with a packetized energy management (PEM) coordinator. The method includes receiving a reference signal from the power grid; filtering the reference signal to create a filtered reference signal; determining, according to the filtered reference signal, whether to grant or deny permission to a plurality of distributed energy resources (DERs) in communication with the PEM coordinator to draw packets of power from or discharge packets of power to the power grid; and granting or denying permission to the DERs to draw or discharge power packets.

In another implementation, the present disclosure is directed to a method of providing ancillary services to a power grid with a packetized energy management (PEM) coordinator. The method includes determining, with a virtual battery model, an aggregate need for energy (NFE) of a plurality of distributed energy resources (DERs) in communication with the coordinator; receiving, from a grid operator, a power grid reference signal; and determining, from the NFE and the power grid reference signal, whether to grant or deny requests from the DERs to receive or discharge power packets.

In yet another implementation, the present disclosure is directed to a computing device. The device includes a processor configured to perform a packetized energy management (PEM) application, the PEM application including instructions for causing the processor to: receive a reference signal from a power grid; filter the reference signal to create a filtered reference signal; determine, according to the filtered reference signal, whether to grant or deny permission to a plurality of distributed energy resources (DERs) in communication with the computing device to draw packets of power from or discharge packets of power to the power grid; and grant or deny permission to the DERs to draw or discharge power packets.

In yet another implementation, the present disclosure is directed to a computing device. The computing device includes a processor configured to perform a packetized energy management (PEM) application, the PEM application including instructions for causing the processor to: determine, with a virtual battery model, an aggregate need for energy (NFE) of a plurality of distributed energy resources (DERs) in communication with the coordinator; receive, from a grid operator, a power grid reference signal; and determine, from the NFE and the power grid reference signal, whether to grant or deny requests from the DERs to receive or discharge power packets.

In yet another implementation, the present disclosure is directed to a method of providing ancillary services to a power grid with a packetized energy management (PEM) coordinator, the method includes communicating with a plurality of distributed energy resources (DERs) to grant or deny permission to the DERs to draw packets of power from, or discharge packets of power to, the power grid; and randomizing a PEM control parameter to minimize synchronization of the drawing or discharging of power packets by the DERs. In some examples, the coordinator determines whether to grant or deny permission according to whether a power grid reference signal is greater than a grid status signal, wherein the randomizing includes randomizing granting permission when the power grid reference signal is greater than a grid status signal; wherein the PEM control parameter is at least one of a control epoch length, a communication epoch length, and a minimum off time between control epochs, the method further comprising transmitting the randomized PEM control parameter to the DERs; wherein the PEM control parameter is a PEM opt-in value for a locally-sensed condition of the DER for opting-in to PEM control of the DER by the coordinator after the locally-sensed condition exceeds a quality of service bound.

In yet another implementation, the present disclosure is directed to a method of providing ancillary services to a power grid with a packetized energy management (PEM) coordinator. The method includes receiving a power grid reference signal; continuously determining, according to the reference signal, whether to grant or deny permission to a plurality of distributed energy resources (DERs) in communication with the PEM coordinator to draw packets of power from or discharge packets of power to the power grid; receiving a directional prediction of the power grid reference signal; and transmitting a PEM control signal to the plurality of DERs according to the directional prediction. Some examples include wherein the PEM control signal is an instruction for a portion of the DERs to transition to a constant power consumption mode; and wherein the PEM control signal is an instruction for a portion of the DERs to transition to a higher or lower request probability profile, the request probability profile defining a probability a corresponding DER will request a power packet during a communication epoch.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 7A-7C illustrate results from an example simulation of a rapid increase in power availability following a long shortage period with and without the use of a reference filter, with FIG. 7A illustrating total TCL power versus time, FIG. 7B illustrating the response of TCLs in cases where no ramp rate limit was applied, and FIG. 7C illustrating the response of TCLs when a ramp rate limit was applied;

DETAILED DESCRIPTION

Aspects of the present disclosure include anonymous, asynchronous, and randomized bottom-up control schemes for distributed energy resources (DERs). Such control schemes may include packetized energy management (PEM) control schemes for managing DERs that are configured to provide near-optimal tracking performance under imperfect information and consumer quality of service (QoS) constraints.

Figure 1:
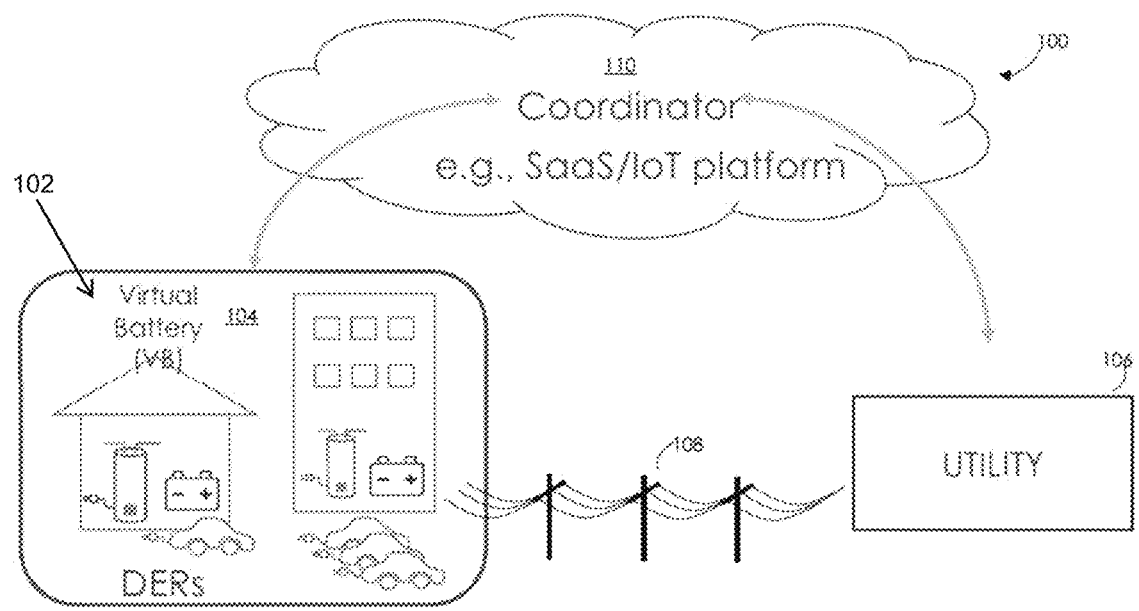
FIG. 1 illustrates an example power system that incorporates packetized energy management coordinators for controlling a plurality of distributed energy resources (DERs)

FIG. 1 illustrates an example power system 100 that includes a plurality of distributed energy resources (DERs) 102 that are aggregated to form a virtual power plant 104. In the illustrated example, each of DERs 102 are configured to be connected to utility 106 through, e.g., power lines 108 for exchange of power therebetween. In the illustrated example, DERs 102 can be managed, or partially managed, using a virtual connection to a coordinator 110. DERs may be communicatively coupled to one or more coordinators 110 by any means known in the art, e.g., local and/or remote communication utilizing any of a wide range of wired and/or wireless communications protocols, including, for example, a digital multiplexer (DMX) interface protocol; a Wi-Fi protocol; a Bluetooth protocol; a digital addressable lighting interface (DALI) protocol; a ZigBee protocol; a near field communication (NFC) protocol; a local area network (LAN)-based communication protocol; a cellular-based communication protocol; an Internet-based communication protocol; a satellite-based communication protocol; and/or a combination of any one or more thereof. As described more below, coordinator 110 may be configured to use information from utility 106 or other sources (e.g., available/forecasted supply, pricing signals, etc.) to determine whether to grant or deny requests from DERs 102 to receive from or provide to utility 106 packets of energy.

The present inventors previously proposed PEM for coordinated charging of plug-in electric vehicles (PEVs) in, for example, U.S. Pat. No. 10,256,631, titled Systems and Methods for Random-Access Power Management Using Packetization, issued Apr. 9, 2019, (the '631 patent) which is incorporated by reference herein in its entirety. The '631 patent discloses, inter alia, PEVs configured to asynchronously request the authority to charge with a specific probability according to their corresponding state in a probabilistic automaton. For example, for a three-state finite-state machine, the probability to request access to the grid from state i is $P\_i$ and $P\_1 > P\_2 > P\_3$. If there is capacity in the grid, the PEV is granted authority by a PEM coordinator to charge, but only for a fixed duration of time (e.g., 15 minutes), referred to herein as the control epoch, and in some examples, a state transition takes place: $P_i \rightarrow P_{i-1}$, which reduces the mean time-to-request by increasing the magnitude of the request probability, P. In contrast, in some examples, if the PEV is denied authority to charge, the mean time-to-request increases by decreasing the magnitude of the request probability with a transition $P_i \rightarrow P_{i+1}$.

The present disclosure includes PEM techniques that may be used with loads whose operations, including request probabilities, are configured to change based on locally-sensed conditions. For example, in some embodiments of the present disclosure, a thermostatically controlled load (TCL) may be configured to make requests for packets of power according to a probability profile, the probability profile defining a probability a DER will make a request to receive or provide power during a particular communication epoch, wherein the probability profile is a function of, e.g., a locally-sensed condition, such as local temperature or state of charge. As described more below, other non-limiting examples of locally-sensed conditions include pressure, e.g. for compressor operations, voltage and state of charge for battery storage systems, etc. It should be noted that exemplary embodiments directed to TCLs are provided for illustrating the disclosure, and absent an express limitation, the scope of the disclosure is not to be limited to TCLs.

Figure 2:
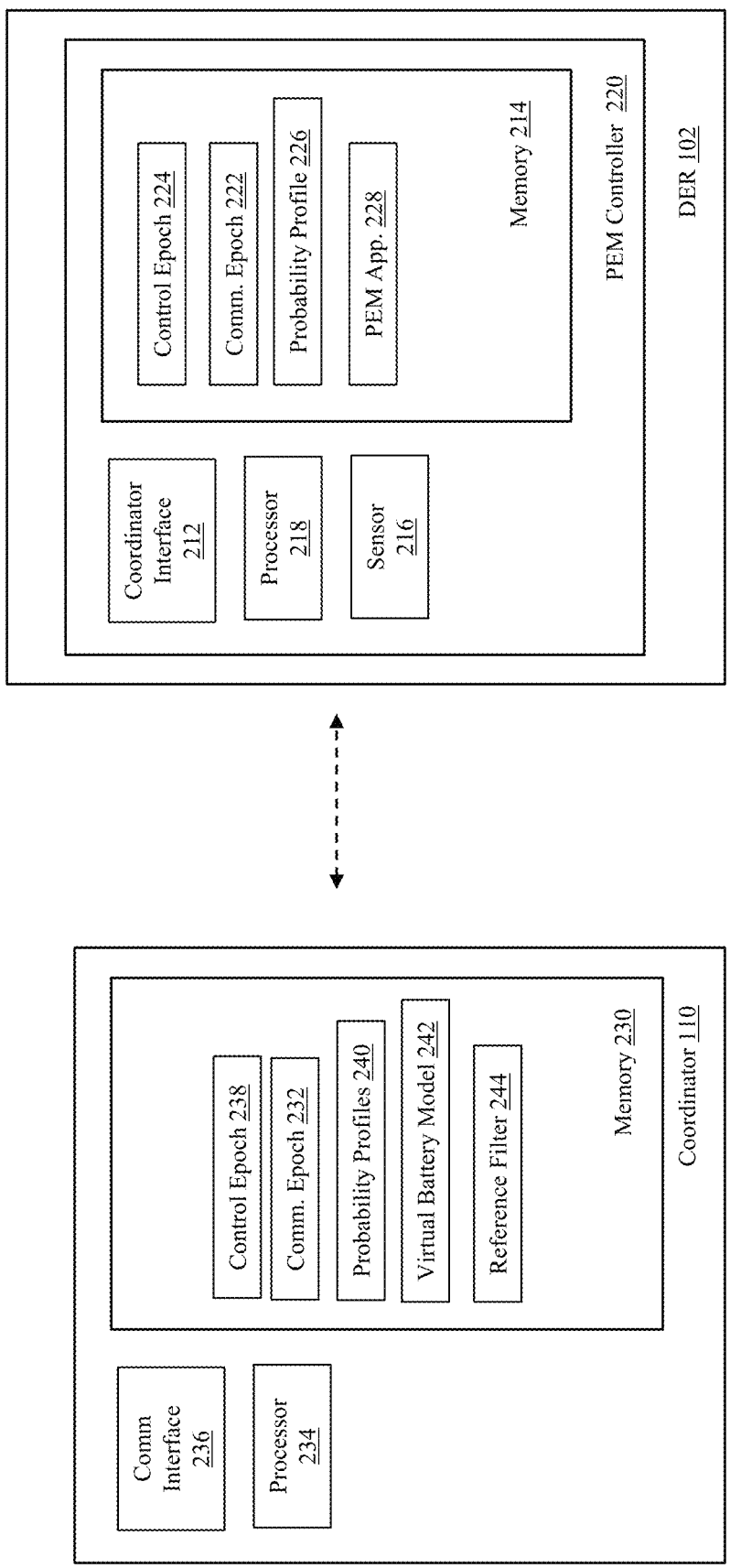
FIG. 2 shows is a functional block diagram of one an example instantiation of a coordinator and DER of FIG. 1.

FIG. 2 is a functional block diagram of one an example instantiation of coordinator 110 and one of DERs 102. As will be appreciated, although only one DER is illustrated, coordinator 110 may be communicatively coupled to a plurality of DERs for PEM control of the DERs. Similarly, although only one coordinator 110 is illustrated, a plurality of coordinators may work independently or collaboratively to manage DERs 102. DER 102 is configured to request receipt or provision of electrical power from coordinator 110 during communication epochs. In the illustrated example, DER 102 includes a packetized energy management (PEM) controller 220 that may include a coordinator interface 212 for communication with coordinator 110 using any wired or wireless communication protocol known in the art. As described more below, any of a variety of energy consuming or generating devices may be modified such that it can be control in a packetized manner using techniques disclosed herein by modifying the device to include PEM controller 220 or otherwise operably connecting a device to a PEM controller. For example, PEM controller 220 may be a physical device co-located with a corresponding DER 102, such as near or incorporated in a DER, such as a hot water heater, EV charger, etc. or may be implemented in a software service, e.g. a software agent or software as a service. For example, a PEM controller 220 may be implemented in the cloud for remotely managing one or more DERs 102.

Coordinator interface 212 may be configured for any communication protocol known in the art via wired and/or wireless communication. In some embodiments, for example, coordinator interface 212 is configured for power line communication with coordinator 110, e.g., using a communication protocol that is transmitted/received over power lines. PEM controller may store one or more communication epoch values 222 and one or more control epoch values 224 in a memory 214. Communication epoch, as used herein, may refer to a length of time between requests made by a DER 102 to the coordinator 110. Control epoch, as used herein, may refer to a length of time a DER draws power from or discharges power to the grid. In some examples, the communication epoch for one or more DERs 102 is fixed and predetermined. In other examples, one or both of the control epoch values 224 and/or communication epoch values 222 may include a plurality of values. A processor 218 of PEM controller 220 may be configured to select one of the plurality of communication epoch or control epoch values. In yet other examples, coordinator 110 may be configured to change the communication epoch for one or more of DERs 102. For example, coordinator 110 may include a memory 230 that includes one or more communication epoch values 232 or otherwise have access to one or more communication epoch values 232 (e.g. from utility 106) that a processor 234 of the coordinator may be configured to transmit individually or via a broadcast to one or more DERs 102, e.g., via a communication interface 236. Coordinator 110 may similarly have one or more control epoch values 238 stored in memory 230 or otherwise have access to such control epoch values and may transmit a specified control epoch value to one or more DERs 102. For example, in some embodiments, one or more specified values for a communication epoch and/or a control epoch may be sent from coordinator 110 to one or more DERs 102 individually or via broadcast communication to reduce or increase the communication or control epoch of one or more DERs.

Memory 214 of PEM controller 220 may also store one or more probability profiles 226 that, as described more below, define a probability a DER 102 will make a request to receive or provide power during a particular communication epoch. PEM controller 220 may also include or be communicatively coupled with one or more sensors 216 for measuring one or more locally-sensed conditions, for example, a temperature, a pressure, a revolution rate, a state of charge, a time-based deadline, or any other condition. For example, a DER 102 may include a temperature sensor to measure the temperature—e.g., a hot water heater may include a sensor to measure a temperature of the hot water stored within a tank of the heater. PEM controller 220 may be configured to receive more than one locally-sensed conditions from more than one sensor 216, for example, a temperature and a state of charge.

PEM controller 220 may also include a processor 218 that may be programmed to execute a PEM application 228 that includes instructions for selecting a request probability profile 226 and determining a request probability for a given communication epoch from, for example, the selected request probability profile 226 and a locally-sensed condition from one or more sensors 216. The request probability may be, for example, a probability that a request will be made during a given communication epoch. In a more specific example, the request probability may be a charge request probability that a request for an energy packet (a charge request) will be sent to the coordinator 110. A given determined probability may be determined based on a selected probability profile 226 and one or more locally-sensed conditions. Coordinator 110 may store one or more probability profiles 240 in memory 2030 or otherwise have access to one or more probability profiles for transmission to one or more DERs 102 for controlling the probability profile applied by a DER. In other examples, Coordinator 110 may include an index that corresponds to probability profiles, for example, high/medium/low and/or AM/PM, and/or summer/fall/winter/spring, etc. and may be configured to instruct one or more DERs 102 to shift to or select the corresponding probability profile stored in DER memory 214. For example, in the case of varying types of DERs 102, e.g., different types of water heaters, air conditioners, freezers, EV chargers, batteries, each DER may store a plurality of probability profiles 226, such as high/medium/low that are specific to the operating characteristics of the DER. Coordinator 110 may send a broadcast to all or a subset of DERs 102 to select one of its corresponding probability profiles, e.g., an instruction to shift to a low probability profile, thereby reducing request probabilities applied by all or a subset of DERs, for example, during a power shortage period.

In some embodiments, the request probability approaches 1 as the locally-sensed condition, e.g., a temperature, T, reaches a lower threshold, T_low, and the request probability approaches 0 when T approaches an upper threshold, T_high. As described below, a DER 102 may be configured to "opt-out" of requesting energy packets from coordinator 110 when T reaches T_low and instead transition to a traditional non-packetized operating mode where power consumption is based solely on comparison of a locally sensed condition to a control band and without reference to a request probability or communication with PEM coordinator 110. In other embodiments, a request probability, e.g., a discharge request probability may approach 1 as a locally-sensed condition, such as state of charge, reaches a high threshold, and the request probability approaches 0 as the sensed condition approaches a low threshold. The DER may also be configured to opt-out of requesting energy packets when T reaches T_high.

DER 102 may be further configured to receive a response to a request. For example, in some embodiments, DER 102 is configured to receive approval from coordinator 110 for a request for an energy packet. In some examples, DER 102 may then change states and/or change to a different probability profile 226 based upon the response. For example, on an approved request, a DER state may change from a first state to a second state. In another example, the DER state may change from a second state to a first state. Other cases exist for DERs with more than two states and will be apparent in light of the present disclosure. The DER 102 may be further configured to access electrical power based on the received response. For example, on approval of the requested energy packet, the DER may access electrical power for a period of time referred to herein as a control epoch. In other examples, DER 102 may not change states and instead maintain the same probability profile 226 whether coordinator 110 accepts or denies a request.

If a DER determines during a communication epoch that it will request to draw an energy packet from, or discharge an energy packet to, an electrical grid, the DER may send a request to the coordinator, or the DER may check a value of a broadcast signal generated by the coordinator. For example, coordinator 110 may directly communicate with individual DERs 102 and grant or deny requests from the DERs as the requests are received by the coordinator. In some examples, the coordinator may instead broadcast an accept or deny message that DERs 102 can monitor to determine whether to draw or discharge power. In some examples, a broadcasted message from coordinator 110 may include a plurality of grant or deny messages, each of the plurality of grant or deny messages being directed to one or more specific DERs 102. For example, a first region of an electric grid may have a power surplus and a second region of the electric grid may have a power deficit. The coordinator broadcast may include a grant message that includes an identifier that corresponds to DERs connected to the first region and a deny message that includes an identifier that corresponds to the DERs connected to the second region. Coordinator 110 may be configured to provide ancillary services to an electrical grid by continuously granting or denying requests and/or broadcasting grant/deny requests in response to long-term, medium-term, and short-term needs. For example, day ahead load forecasting, minutes ahead pricing, and real-time frequency regulation.

Coordinator 110 may also include a virtual battery model 242 that models one or more of the DERs 102 controlled by the coordinator as a "virtual battery" by modeling the aggregate stored energy of the DERs and in some examples, a prediction of a future energy levels. The stored energy or "state of charge" can also be viewed in the inverse as each DER's current or forecasted "need for energy" (NFE). Non-limiting examples, of a need for energy include temperature, state of charge (for a battery), a prediction of future usage requirements, the cleanliness of water in a pool for a pool pump or a hot tub, the predicted need for charge in an upcoming driving event for an EV, or anything else in which sensors, user inputs and historical data indicate that there is a current or future need for energy. In one example, the coordinator does not need to receive detailed information on the state of energy from each DER such as the preceding non-limiting examples. Instead, in one example, the only information the coordinator receives from the DERs is the rate of requests to receive or discharge energy packets. The coordinator may then be configured to execute a virtual battery model and estimate the fleet NFE. Thus, the coordinator can model or estimate the NFE of the fleet of DERs while maintaining the anonymity of the members of the fleet. In another example, a coordinator is configured to use additional data collected from DERs other than request rate to estimate and develop parameters for a virtual battery model of the fleet of DERs. Non-limiting examples of information received from DERs includes the amount of power the DER is discharging or drawing, a DER's target set point and current value (e.g., a target or setpoint temperature and a current temperature), or a current operating mode of the DER (e.g., Normal or Eco or Performance mode). For example, virtual battery model 242 may include the following:

$$E[k+t] = \eta_1 E[k] + \eta_2 P_c[k]\Delta t + \eta_3 P_d[k]\Delta t + \eta_4 P_u[k]\Delta t$$
$$E_{min}[k] \leq E[k] \leq E_{max}[k] \qquad \text{Eq. (1)}$$

wherein:

$E[k]$ is a measure of the fleet-wide energy storage at time k;

$\eta_1, \eta_2, \eta_3, \eta_4$ are efficiency-like constants learned from data and/or computational models;

Emin and Emax are model parameters indicating the upper and lower limits on energy storage for the virtual battery;

$P_c[k]$ is the charging power, or the power that the coordinator allows the DERs as a fleet to consume. In examples where the virtual battery does not include batteries, or $P_d[k]<0$ this value may correspond to the balancing reference signal e(t) (see, e.g., FIG. 6A) for the virtual battery.

$P_d[k]$ is the discharging power, or the power the coordinator allows the DERs as a fleet to discharge into the grid; and $P_u[k]$ is the power the DERs are using internally (for example the water heaters using hot water from the tank). In one example, $P_u[k]$ is derived from available data and models, for example, averaged baseline behavior.

The Coordinator may use a wide range of data to estimate the parameters of the virtual battery model, including weather information, such as ambient temperature data, information about requests from DERs, total power used by charging and discharging DERs, and data sent by the DERs to the coordinator. Model parameters may be initiated at best estimate or nominal values and be modified over time and stored in memory 230. Coordinator 110 may be configured to use virtual battery model 242 to compute an optimal trajectory for the fleet of DERs (the "virtual battery"), which may be used to determine an estimate of a set point power, P[k] for all k greater than the current time, where set point power is Pc[k]−Pd[k]. As described more below, coordinator 110 may be configured to continuously adjust the set point power in response to signals from the utility and to continuously accept or deny charge and discharge requests to track the set point power. Virtual battery model 242 may also separately model the aggregate energy storage and future energy needs of a subset of DERs located in specific geographic regions or connection to certain segments of an energy grid for localized PEM management of a subset of DERs.

Coordinator 110 may also include one or more a reference filters 244. As described more below, reference filter 244 may be used to filter a reference signal from a utility to shape, limit, or otherwise modify the utility signal to, for example, optimize the long-term performance of a fleet of DERs 102.

Figure 3:
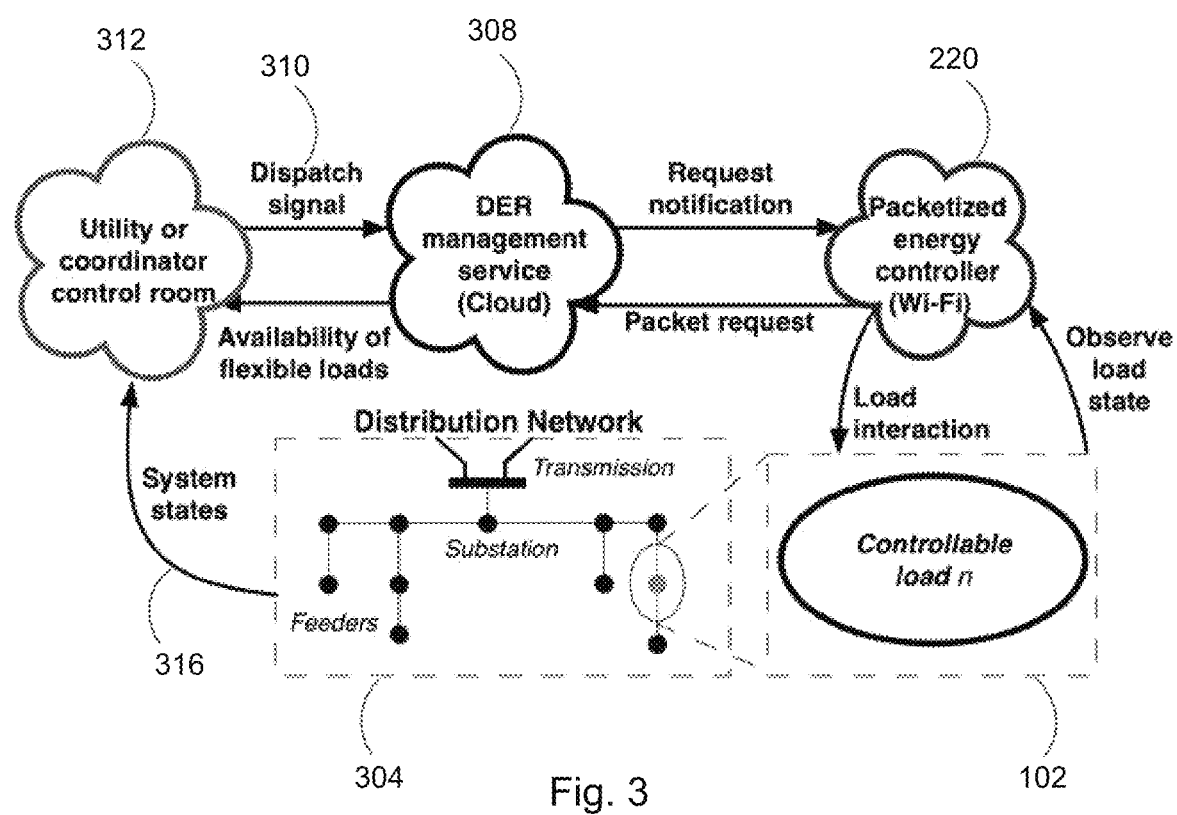
FIG. 3 illustrates an example instantiation of the power system of FIG. 1.

FIG. 3 illustrates an example instantiation of system 100 (FIG. 1) in the form of system 300. A DER 102 is physically connected to a distribution network 304 of a utility and communicatively coupled to a PEM controller 220. PEM controller 220 is communicatively coupled with a cloud-based DER management system 308 that may include one or more PEM coordinators 110 (see FIG. 2). Management system 308 is configured to receive reference signals 310 from a grid operator 312 and coordinate flexible energy resources (DERs 102) to track the balancing reference signal. As shown, management system 308 may also be able to communicate with grid operator 312, for example with information 314 on the availability of DERs 102. Grid operator 312 also receives information 316 on the state of the distribution network 304 such as such as voltage, frequency, and power flows.

DER management system 308 may include a plurality of coordinators 110, each coordinator in communication with a corresponding fleet of DERs, for example, in a corresponding geographic region. For example, distribution network 304 may have any topology known in the art, such as transmission, distribution, feeder, and neighborhood levels. Management system 308 may include a plurality of coordinators 110 for controlling DERs connected to specific portions of the grid. Similarly, reference signals 310 may include reference signals for specific sections of the grid so that the coordinators can separately control DERs in different geographic regions so that the net energy load of the DERs located or otherwise electrically proximate each region tracks the corresponding grid reference signals 310 for each region. As described more below, management system 308 may also receive directional predictions of the reference signals, which may also be dependent on geography so that coordinators 110 can leverage local grid predictions to manage a geographic network of DERs. In another example, a coordinator 110 may be configured to control multiple regions of DERs connected to corresponding multiple regions of distribution network 304 by comparing the requests for a specified region of DERs to a corresponding region-specific reference signal. For example, DERs could include a region ID in their requests, the coordinator could model each region as a separate virtual battery, and the coordinator could similarly receive region-specific reference signals from the utility for granting or denying requests.

Traditional Control of TCLs

The vast majority of traditional TCLs operate in a binary (ON/OFF) manner and are already controlled by simple state machines—thermostats that change state based on temperature thresholds. Locally, a TCL is controlled to maintain a desired temperature set-point, $T_n^{set}$, within a temperature dead-band, $T_n^{set} \pm T_n^{set,DB}/2$. This yields the standard TCL hysteretic temperature response according to local discrete-time control logic:

$$z_n[k] = \begin{cases} 1, & T_n[k] \le T_n^{set} - T_n^{set,DB}/2 \\ 0, & T_n[k] \ge T_n^{set} - T_n^{set,DB}/2 \\ z_n[k-1], & \text{otherwise} \end{cases} \quad \text{Eq. (2)}$$

The aggregate response under the above fully-decentralized control logic is referred to herein as the "no-control" case. The PEM schemes disclosed herein may be implemented by simply replacing the existing state machine with a more sophisticated one—e.g., PEM controller 220—that interacts with a coordinator 110.

Example Application of PEM to TCLs

Figure 4:
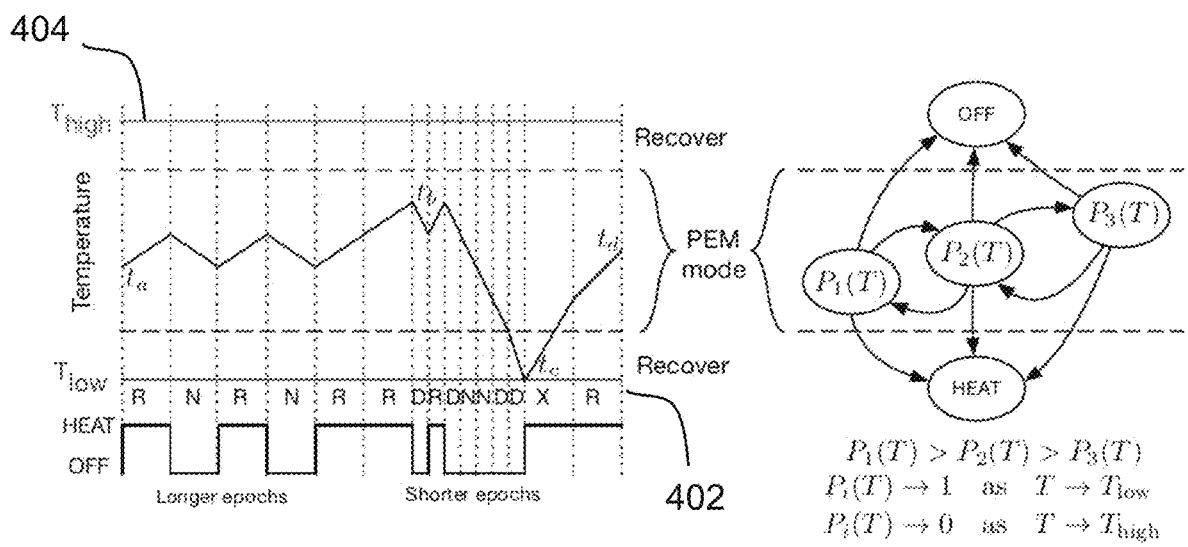
FIG. 4 illustrates an example of controlling a DER in the form of a water heater with an exemplary embodiment of a PEM controller.

FIG. 4 shows an example control of a DER 102 in the form of a water heater managed by an exemplary embodiment of a PEM controller 220. The left figure shows a sequence of events. At time t_a, when grid resources are unconstrained, the DER stochastically requests (R) or does not request (N) energy. At t_b, the system approaches a period of constrained supply, in which a system coordinator mostly denies requests (D) and reduces the control epoch length to reduce the amount of energy drawn during any one control epoch. As a result, in one example, the PEM controller transitions to a lower probability state or profile (e.g., e.g., $P_1 \rightarrow P_2$). In another example, a PEM controller may not change probability profiles in response to an accept or deny response from a coordinator. At t_c, the temperature hits a QoS bound 402 and the load exits (X) from PEM and rapidly seeks to recover temperature to within the QoS bounds, which occurs at t_d. The right portion of FIG. 4 illustrates one example of a PEM controller changing request probabilities ($P_i(T)$) and, in some examples, its control and/or communication epoch lengths.

FIG. 4, therefore, illustrates the operation of an example DER in the form of an electric furnace or water heater or other device configured to consume electric power to control a temperature. When the locally-sensed condition, here local temperature, T, of the TCL, is between its upper 404 and lower 402 temperature limits for PEM operation, the TCL's time-to-request may be driven by, for example, a probability profile that defines request probability as a function of locally-sensed conditions. In some examples, as described more below, the probability profile may be an exponential distribution whose mean is inversely proportional to T relative to the upper limit, T_high. For example, TCLs with temperatures very close to the lower threshold make requests with near certainty (i.e., $P_i(T \rightarrow T_{low}) \approx 1$) and those near the upper limit in temperature will make requests with low probability (i.e., $P_i(T \rightarrow T_{high}) \approx 0$).

Upon transmitting a request and, if there is capacity in the grid, the TCL will be given the authority to turn ON for a fixed control epoch length $\delta_t$ (i.e., $z_n(t)=1$ for $t \in (t_0, t_0+\delta_t)$), and in some examples, a state transition occurs: $P_i(T) \rightarrow P_{i-1}(T)$. If the request is denied, in some examples, the TCL finite state machine may transition to a state with lower mean time to request (MTTR), $P_i(T) \rightarrow P_{i+1}(T)$, but may immediately resume requesting with temperature-dependent probability. If access is denied repeatedly, T reaches $T_{low}$ 402, which causes the TCL to exit (i.e., opt-out of) the PEM scheme to guarantee that temperature bounds are satisfied. An illustrative ON/OFF cycle of a packetized water heater is illustrated in FIG. 4 (left). Note that the illustrative control depicted in FIG. 4 would be reversed if the DER was a cooling DER (i.e., a DER managing a cooling DER such as, for example, a freezer, etc.)

In addition to the TCL receiving an "allow/deny" response to a request, the TCL may also receive an updated (global) control epoch length, $\delta_t$, thus enabling tighter tracking in the aggregate, which is helpful during ramping events. In the example, while a TCL is ON, it does not make requests.

In one example, a plurality of DERs in the form of TCLs may be configured to operate in the manner illustrated in FIG. 4, and a DER coordinator (e.g., coordinator 110) may be configured to grant or deny the authority to turn on without requiring any knowledge or tracking of particular DERs. Furthermore, in some examples, the coordinator does need to track which TCL is making a particular request. As each TCL is controlled by its corresponding PEM controller and probability profile, and its ability to turn on depends only on the real-time system capacity, in one example, any TCL making a request at the same point in time will be treated the same by the coordinator. As such, PEM control schemes disclosed herein maintain privacy while still being fair to customers. As described more below, PEM approaches disclosed herein can be agnostic to the types or mix of TCLs being coordinated. That is, electric water heaters and air conditioners can be managed on the same system. The quality of service for customers can be maintained through each device's ability to temporarily "opt-out" of PEM when the device's condition falls out of the deadband (e.g., between T_low 402 and T_high 404).

In a discrete-time implementation of PEM of a DER, the probability that DER n with local condition $C_n[k]$ in automaton state i requests access to the grid during time-step k (over interval $\Delta t$) may be defined as $P\_i(C\_n[k])=F(Cn[k], i)$, where the function, F, can vary depending on a particular application. One example application for TCLs is as follows.

Example Probability Profile for TCLs

In a discrete-time implementation of PEM for a DER in the form of a TCL, the probability that TCL n with local temperature $T_n[k]$ in automaton state i requests access to the grid during time-step k (over interval $\Delta t$) may be defined by the cumulative exponential distribution function:

$$P_i(T_n[k]):=1-e^{-\mu(T_n[k],i)\Delta t} \quad \text{Eq. (3)}$$

where rate parameter $\mu(T_n[k], i)>0$ is dependent on the local temperature and the probabilistic automaton's logic state i. This dependence is established by considering the following boundary conditions:

1. $P_i(\text{TCL n requests access at k}|T_n[k]\leq T_i^{min})=1$
2. $P_i(\text{TCL n requests access at k}|T_n[k]\geq T_i^{max})=0$, which give rise to the following design of a PEM rate parameter:

$$\mu(T_n[k], i) = \begin{cases} 0, & \text{if } T_n[k] > T_n^{max} \\ \frac{T_n^{max} - T_n[k]}{T_n[k] - T_n^{min}} M_i, & \text{if } T_n[k] \in (T_n^{min}, T_n^{max}] \\ \infty, & \text{if } T_n[k] \leq T_n^{min} \end{cases} \quad \text{Eq. (4)}$$

where $M_i>0[1/sec]$ is a design parameter that depends on the TCL's automaton state i and defines the MTTR. For example, if one desires a MTTR of 5 minutes, $$M_i = \frac{1}{600} \text{ Hz.}$$

Figure 5:
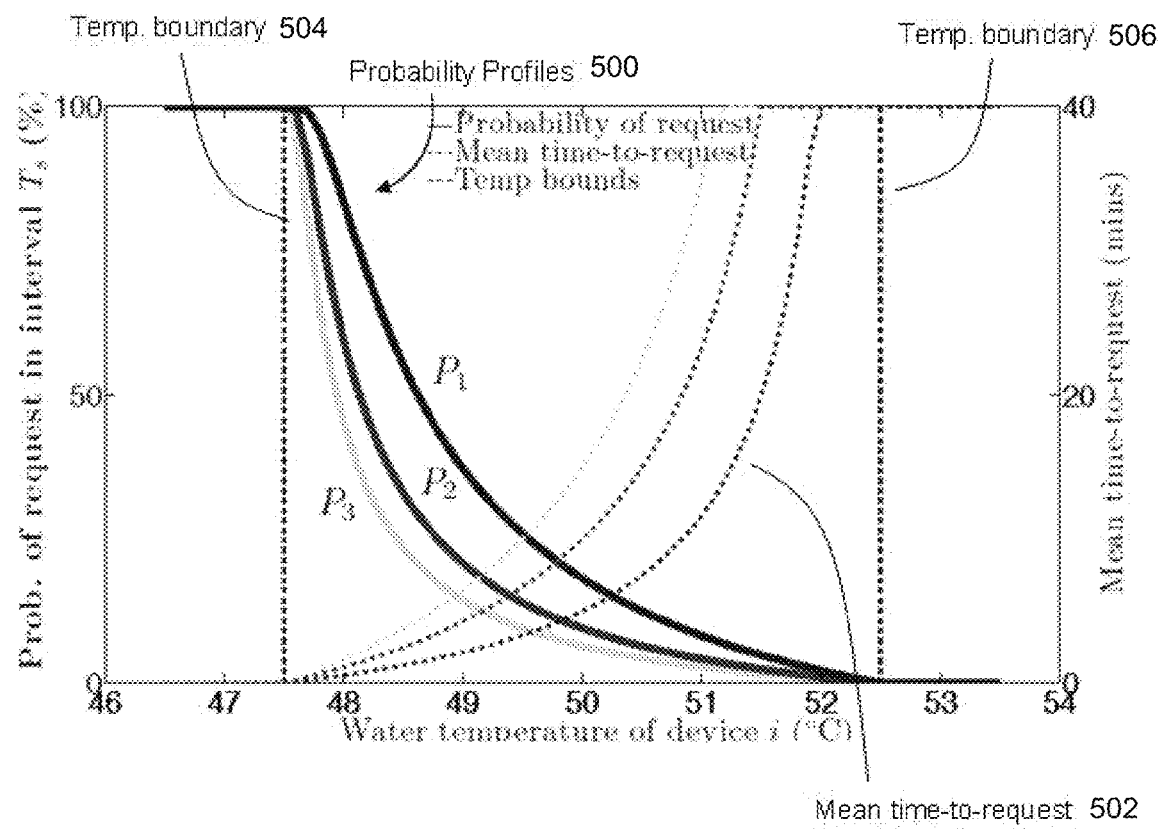
FIG. 5 illustrates example probability profiles that may be used by a PEM controller.

For a symmetric dead-band, e.g., $T_n^{min}$, $T_n^{max}:=T_n^{set}\mp T_n^{set,DB}/2$, then the mean time-to-request (MTTR) for TCL n with $T_n[k]=T_n^{set}$ is exactly described by $1/M_i$ (in seconds), which represents a useful parameter for design of the finite-state machine. FIG. 5 illustrates three example probability profiles 500—P1, P2, P3. In the illustrated example, $P_1(T_n[k])>P_2(T_n[k])>P_3(T_n[k])$. In the case of asymmetric dead-band, $M_i$ can still be an effective design parameter by generalizing the middle condition of Eq. (4):

$$\mu(T_n[k], i) = \left(\frac{T_n^{max} - T_n[k]}{T_n[k] - T_n^{min}}\right)\left(\frac{T_n^{set} - T_n^{min}[k]}{T_n^{max}[k] - T_n^{set}}\right) M_i. \quad \text{Eq. (5)}$$

FIG. 5 illustrates example probability profiles 500 implementing Equation 3, above, and shows three example probability profiles P1, P2, and P3 as a function of a locally-sensed condition, here the water temperature of the device. FIG. 5 also shows low and high temperature boundaries 504, 506. FIG. 5 also shows MTTR profiles 502 for P1, P2, and P3, which in the illustrated example, illustrate the inverse relation to the corresponding probability profile. For graphical purposes only, the mean time-to-request have been truncated to 40 minutes. In the illustrated example, each of the probability profiles approach a value of 1 or 100% as the temperature drops to low temperature boundary 504 and decreases to zero as the temperature approaches the high temperature boundary 506. The MTTR profiles represent the average time between requests associated with a given probability value over a large number of communication epochs. Thus, as the probability of making a request decreases, for example, as temperature increases, the length of time between requests will increase. As will be appreciated, in other examples, probability profiles may be defined by equations other than exponential curves, such as one or more of linear, sinusoidal, square wave, step change, etc. In some examples, a probability profile may be a single value that is independent of any locally-sensed condition. Probability profiles P1, P2, and P3 may be associated with different modes of operation, for example, P1, defines higher probabilities as a function of temperature than curves P2 and P3 and are examples of probability profiles 226 and 240 (see FIG. 2). In other examples, probability profiles may intersect. For example, $P\_a(T1)>P\_b(T1)$ but $P\_a(T2)<P\_b(T2)$.

As described above, a memory of a PEM controller such as memory 214 of PEM controller 220 may store a plurality of probability profiles 226, such as profiles P1, P2, and P3, and the PEM controller processor 218 may be configured to first determine which profile to apply and then determine a specific probability, for example, according to locally-sensed conditions. The PEM controller may be configured to select one of a plurality of probability profiles based on any of a variety of factors or inputs. For example, the PEM controller 220 may shift to a lower probability profile, e.g., from P1 to P2, in response to a coordinator denying the controller's request to consume a power packet. In some examples, the controller may receive a command from a coordinator to shift probability profiles, or to select a specific probability profile, or a controller may receive a probability profile from a coordinator for storage in memory and for application by the controller. For example, in response to an energy shortage, a coordinator may send a PEM control signal as individual commands or a broadcast that one or more DERs shift to a lower probability profile.

Referring again to FIG. 4, with the stochastic nature of TCLs under PEM, it is entirely possible that a disturbance (e.g., a large hot water withdrawal rate) can drive $T_n[k]$ below $T_n^{min}$. Therefore, to maximize quality of service to the consumer (i.e., avoid cold showers), in some embodiments of the present disclosure, a TCL under PEM can temporarily exit (i.e., opt-out of) PEM and operate under traditional TCL control (e.g., turn ON and stay ON). This is illustrated in FIG. 4 (left) at event $t_c$ and with HEAT/OFF automaton states in FIG. 4 (right). That is, once a TCL under PEM exceeds temperature bounds, traditional control logic may temporarily be employed to bring the local temperature within PEM "recovery bounds" $T_n^{set} \pm T_n^{set,PEM}/2$ with $T_n^{set,PEM} < T_n^{set,DB}$ when PEM control logic is reinstated (i.e., TCL opts back into PEM). The recovery bounds are helpful to avoid excessive exit/re-entry cycling at the min/max bounds. While cold showers are undesirable, overheating hot water heaters can be dangerous to consumers and damaging to the water heaters. As such, a TCL under PEM may be configured to never actuate if $T_n[k] > T_n^{max}$.

Example PEM Control Schemes

Figure 6A:
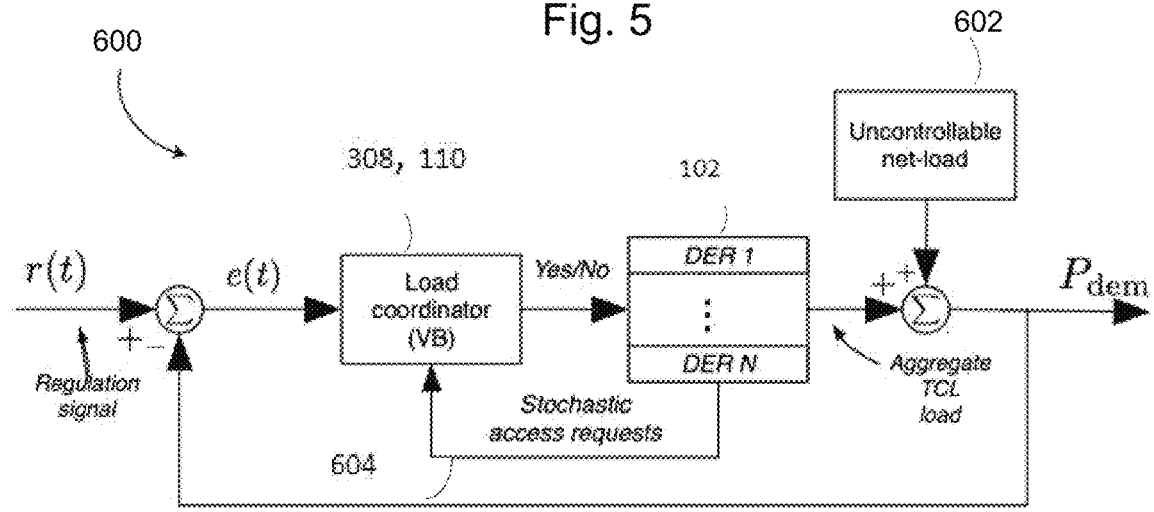
FIGS. 6A-6C illustrate example PEM control schemes.
Figure 6B:
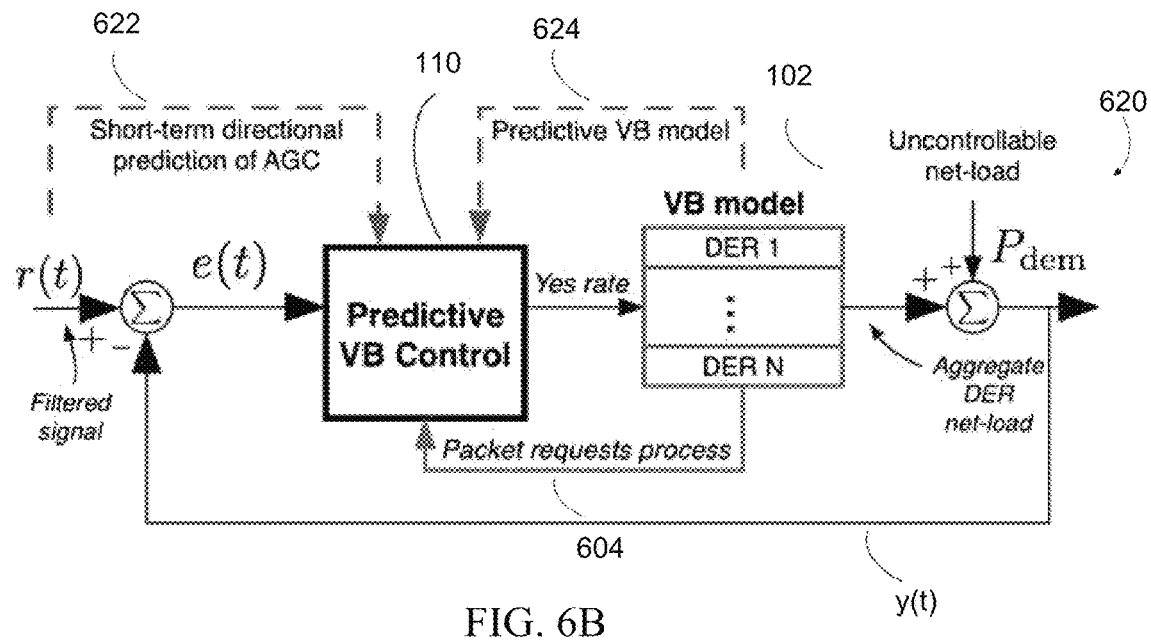
Figure 6C:
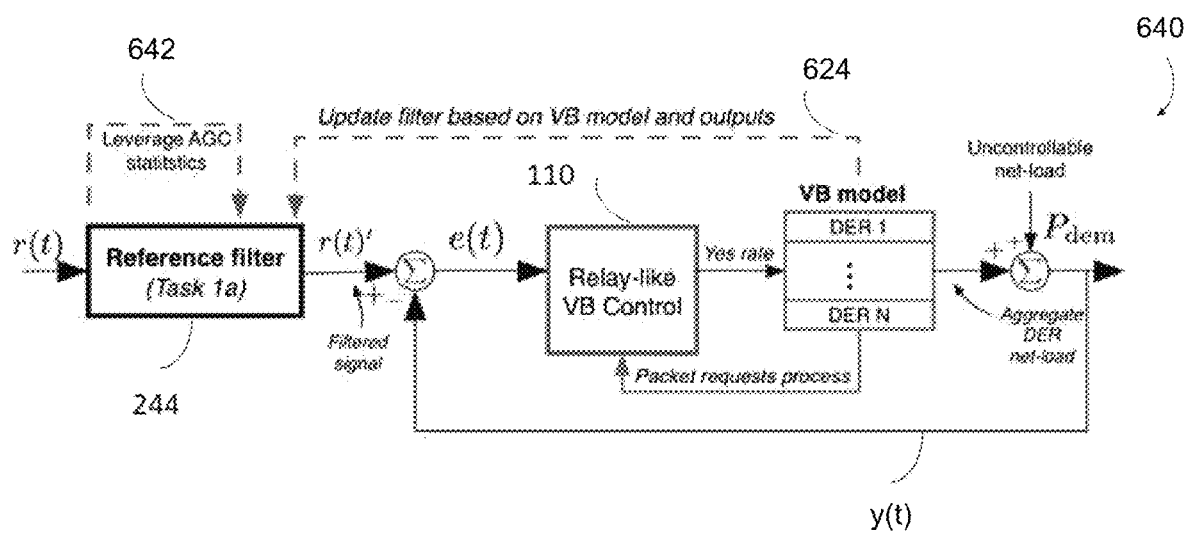

FIGS. 6a-6c illustrate examples of PEM control schemes of the present disclosure.

FIG. 6A is a diagram depicting a closed-loop feedback system 600 for PEM with a reference r(t) (in one example, reference r(t) corresponds to dispatch signal 310 (FIG. 3) that may be provided by a grid operator (e.g. grid operator 312 (FIG. 3) and an aggregate system output response y(t) measured by grid operator 312 (FIG. 3) which is the real-time net power load of both the controllable packetized DERs 102_1-102_n that are participating in PEM (e.g., that have not "opted out" as described herein) and the net load of uncontrollable loads 602, which can include DERs that have opted out as well as other non-PEM loads. In one example, y(t) is provided to management system 308 by grid operator 312, for example, the grid operator can measure total real-time demand at one or more locations of distribution network 304, for example, at one or more feeder and/or substation locations, and provide the real-time demand to management system 308. Reference r(t) can be a voltage reading, available supply signal, energy pricing information, etc.

Referring again to the exemplary embodiment of FIGS. 2 and 3, management system 308, which may include one or more coordinators 110 (FIG. 2) that receive balancing commands in the form of reference signal r(t) from grid operator 312 and coordinates flexible energy resources (DERs 102) to track the balancing command. In control system 600, one or more coordinators 110 are configured to track reference signal r(t) by responding to load access requests 604 from DERs with "Yes" or "No" notifications based on a real-time output error between real-time net power load, y(t), and the reference signal, r(t): e(t):=r(t)-y(t). In one example, coordinator 110 may be configured such that if e(t)>0 then "Yes"; else "No." In one example, coordinator 110 may be configured for the following inputs and outputs:

Input: Balancing reference signal, e(t)
Output: Yes/No access notification; control epoch length.

The transmission (e.g., ISO New England) or distribution utility system operator (e.g., a DSO Control Room (grid operator 312, FIG. 3) may be able to measure or estimate the states of distribution network 304, such as voltage, frequency, and power flows. Under scenarios with high penetration of renewable energy, the grid operator will find it ever more difficult to balance demand and supply and will be able to leverage the flexible packetized DERs sitting in customer homes and industrial/commercial facilities as described herein. This can be achieved by signaling individual balancing commands via individual reference signals, r(t) to coordinator 110 across the distribution network 304 in near real-time, akin to Automatic Generator Control (AGC) signals, which are transmitted every 4-5 seconds today. Thus, grid operator 312 may be summarized by the following inputs and outputs:

Input: Grid states and net-load forecasts;
Output: Balancing request signal, r(t)

By managing anonymous, fair, and asynchronous requests for packetized loads via a coordinator that receives grid or market-based balancing signals from a grid operator, PEM represents a bottom-up distributed control scheme.

Grid operator 312 may determine reference signals r(t) based on multiple time scales, for example, (1) long term (e.g., day ahead load) forecasting to curtail loads for peak load reduction purposes; (2) medium term (e.g., minutes ahead pricing) to encourage/dissuade resources to/from operating based on the signal, which may be an economic one (price); and (3) real-time (e.g., second by second) to encourage/dissuade resources operating for frequency regulation or other ancillary grid services. The reference signals r(t) may be distributed at any location in the distribution network, such as at the transmission, distribution, feeder, and/or neighborhood levels of the network.

Grid operator 312 may receive a plurality of external signals as input for determining reference signals r(t), for example, economic information from the system (prices, cost of generation, etc.); information about the state of the distribution network 304 (highly loaded network components, etc.), information about the probability of a time period being a peak load event, and forward looking forecast for of any of the preceding external signals.

FIG. 6B illustrates another example of a closed-loop feedback system in the form of a predictive closed-loop feedback system 620, which is a modified version of system 600 (FIG. 6A) to incorporate a look-ahead period to change the 'Yes rate' by coordinator 110 configured with predictive virtual battery control. Specifically, coordinator 110 may receive a prediction of the reference signal, r(t) and an estimated need for energy (NFE) of all DERs 102 controlled by the coordinator, as modeled by virtual battery model 242 (FIG. 2). As noted above, the NFE may be a measure of an aggregate amount of energy currently stored by the DERs and/or a prediction of a future need for energy by the DERs. Thus, as with control system 600, in control system 620, grid operator 312 provides a reference signal r(t) which is compared to real-time net power load, y(t), to determine a balancing reference signal, e(t). Coordinator 110 is configured to receive directional predictions 622 from grid operator 312 on future changes in reference signal, r(t), on one or both of long-term and medium-term time scales. Non-limiting examples of directional predictions of a power grid reference signal, r(t), are an automatic generation control signal, a spinning reserves dispatch signal, and an inverse of wholesale energy prices. Coordinator 110 may be configured to process predictions 622 and fleet NFE information 624 from virtual battery model 242 to determine whether to accept or deny specific requests 604 in view of a current value of balancing reference signal e(t). For example, balancing reference signal e(t) may indicate a nominal amount of energy is available for granting power requests, however, virtual battery model 242 may indicate the aggregate NFE of the DERs is relatively low and prediction 622 may indicate that a period of energy shortage is approaching. Management system 308 may decide to grant more power requests and deny more discharge requests than it would otherwise given the current value of balancing reference signal e(t) in order to increase the aggregate energy storage of the fleet of DERs in advance of the expected energy shortage.

FIG. 6C illustrates yet another example of a closed-loop feedback system in the form of a predictive-precompensator closed-loop feedback system 640. System 640 applies a reference filter 244 (see also FIG. 2) that filters reference signal r(t). Reference filter 244 may be configured as a pre-compensator with features similar to the predictive virtual battery model control features of coordinator 110 in FIG. 6B. Specifically, reference filter 244 may receive statistics and predictions 642 of the reference signal, r(t) and an estimated NFE 624 of all DERs 102 controlled by the coordinator, as modeled by virtual battery model 242. Filter 244 may be configured to modify reference signal r(t) to optimize tracking over time. For example, filter 244 may provide a low-pass response so that e(t) captures the variability in the uncontrollable load (e.g., when renewables are fluctuating). A low-pass filter can help avoid having the fleet of DERs, acting in aggregate as a virtual battery, from jumping up and down to chase large, but transient changes in r(t). In another example, filter 244 may provide a high-pass filter where the DERs acting as a virtual battery compensate for the variability in r(t). In another example, filter 244 may be configured to re-shape reference signal r(t) to optimize the capabilities of the fleet of DERs (the virtual battery, VB) over a given timeframe, e.g., to optimize long-term performance of the VB. As one example, r(t) may be a moving average and autocorrelation over a preceding timeframe, e.g., 5 minutes, of a grid-supplied frequency regulation signal. Coordinator 110 and/or reference filter 244 may also receive VB model information (fleet NFE information 624), e.g., energy stored. This information can be used by filter 244 to determine specifications of a finite impulse response (FIR) filter (e.g., bandwidth). Weighted least squares or other design methods may be used to determine optimal FIR filter coefficients to satisfy specifications.

Filter 244 is configured to output a filtered reference signal r(t)′, which can then be compared to real-time net power load y(t) to determine balancing reference signal e(t). In the illustrated example, balancing reference signal e(t) is used by one or more coordinators 110 of management system 308 to grant or deny requests according to whether the value of e(t) is greater than or less than zero. As will be appreciated, features from the control architectures illustrated in any of FIGS. 6A-6C may be combined in a variety of ways, for example, reference filter 244 may be combined with the predictive virtual battery control coordinator 110 of FIG. 6B.

FIGS. 7A-C illustrate one example application of reference filter 244 in the form of a low-pass filter on reference signal r(t) to limit a rate of change of balancing reference signal e(t) to prevent rapid increases in charging after a long shortage period. FIGS. 7A-C illustrate the results from an analysis of PEM performance under severe operating conditions. More specifically, four versions of PEM control schemes, each in the illustrated example with a control epoch of 5 minutes, were employed for a load reduction event to investigate the rebound effect of packetized water heaters when all requests over a 6-hour period (minutes 180-540) were rejected. The four cases shown include two cases, 704, 706, where no reference filter was applied (referred to in FIG. 7A as "no ramp limit"), a case 704 with a MTTR of 30 seconds, and a case 706 with a MTTR of 300 seconds, meaning case 706 had a lower request probability than case 704. And two cases 708, 710, where a reference filter was applied, (referred to in FIG. 7A as VB ramp limit), a case 708 with a MTTR of 30 seconds, and a case 710 with a MTTR of 300 seconds. FIG. 7A also shows reference signal r(t) 702, which had a step change from 0 to approximately 5 MW at time 540.

7A illustrates a portion of this 6-hour reduction event. After the six hours of the coordinator rejecting every request, the water heaters are allowed full access to the grid (i.e., all requests are accepted by a coordinator). This scenario can be thought of as an extreme peak reduction event by a utility or load aggregator. In the illustrated example, while the coordinator declined all packet requests, most or all of the PEM-controlled water heaters eventually opted out of PEM to maintain QoS. Thus, the only power consumed during the 6-hour period was from water heaters that had opted out. In the illustrated example, when a water heater's temperature dropped below $T\_n\_set-T\_n\_set\_PEM=0.92 \times T\_n\_set$, meaning the water heater's temperature was measured to be in the zone that is below the consumer's preferences, the heater automatically turns on (w/o permission from the coordinator. As illustrated in FIG. 7A, during the load reduction period (prior to minute 540), the aggregate opt-out consumption in the example stabilized around 1000 kW. However, during this opt-out period, large groups of water-heaters naturally become synchronized and, at minute 540, when the reference abruptly changes, the coordinator can experience large MW-scale (damped) oscillatory ramping events as shown in FIGS. 7A and 7B for the "No ramp limit" cases 704 and 706 where the coordinator just accepts all incoming requests. The large oscillations occur at a period equal to the control epoch until the randomizing nature of PEM desynchronizes the population. Note that shorter MTTR (and a corresponding higher request probability) begets increased oscillations as more frequent requests prevent desynchronization.

To prevent this large spike, the coordinators in cases 708 and 710 were equipped with a reference filter 244 that included a ramp-rate limit, e.g., 300 kW per minute, which effectively limits the number of packets that can be accepted during an interval (e.g., 60 packets per minute). As displayed in FIGS. 7A and C, the coordinator ramp-rate limit reference filter is clearly successful in mitigating the rebound effect as it prevents re-synchronization of packetized loads between control epochs and limits the initial rebound peak by about 75%. A potential drawback of a ramp-rate limit is a longer recovery period, which could impact future availability of PEM for tracking or additional peak reduction services. In another example, coordinator 110 may also be configured to broadcast a standby command to the fleet of DERs instructing any DER with a locally-sensed condition above a minimum threshold to transition to a standby mode and not make a request for power. For example, any water heater with a temperature above a minimum value should standby and not request a power packet until further notice. Such a standby command broadcast can be sent immediately prior to the end of a long shortage period to minimize the number of DERs that draw power after the shortage period ends and the utility reference signal r(t) increases. A standby command can be used in combination with or separately from reference filter 244. In other examples, where there is an energy surplus, or coordinator 110 otherwise determines the fleet of DERs should draw power, coordinator 110 may be configured to send a PEM control signal that instructs all or a subset of DERs to request power at a greater rate than they currently are by shifting to a higher probability profile, or by automatically requesting power during every communication epoch, i.e. a probability of 1, or by transitioning to a constant power consumption mode.

In one example, a reference filter ramp-rate limit (RRL) may be implemented with a moving window integrator (MWI) that adds up the power from all accepted packet requests over a preceding Delta t time period and compares the fleet of DER's (the "VB's") actual ramp-rate (e.g., kW/min) to the ramp-rate limit. If the VB is currently operating at or above the VB ramp-rate limit, incoming packets will be denied even if the real-time net power load, y(t), is below a power grid reference signal r(t) provided by, e.g., grid operator 312.

$$MWI(t) = \frac{1}{\Delta t} \sum_{\tau=t-\Delta t}^{t} P_{yes}[\tau]$$  Eq. (6)

Then, while/if MWI(t)≥RRL, then deny packet requests. Else, let a coordinator 110 determine whether to accept or deny request according to other logical conditions the coordinator is configured to evaluate. For example, the RRL may be part of a logical energy packet request decision hierarchy that the coordinator is configured to execute to determine whether packet requests should be accepted or denied. In one example, a coordinator is configured to accept an energy packet request when decision hierarchy results in a yeses (or "green" lights) from ALL coupled logical entities or conditions.

In another example, additional randomization may be injected into PEM control schemes of the present disclosure by modifying the coordinator's acceptance of packet requests. For example, in closed-loop feedback system 600 of FIG. 6, coordinator 110 is configured to accept all power packet requests 604 that are received when balancing reference signal e(t) is greater than zero. Coordinator 110 may be configured to randomize acceptances of packet requests 604, either only when balancing reference signal e(t) is greater than zero or also when the balancing reference signal is less than zero, to further randomize the fleet of DERs. Any of a variety of inputs may be used for the randomization of coordinator acceptance, including external signals, analytical models, utility grid statistics, and predictions, such as prediction of prices, weather, or other relevant parameters. In another example, additional randomization to prevent synchronization can be achieved by applying a probability of achieving a set point. Setting the probability high or low would increase/decrease a ramp rate limit. For example, a coordinator 110 may determine the aggregate stored energy of a fleet of DERs 102 as a whole should be increased but that there is a significant amount of time to do so (e.g., the coordinator has overnight to move water heaters to a high temperature for morning use). Thus, the coordinator may initial set a probability of achieving the set point during the night to a low value and then increase the value, the low value corresponding to a lower ramp rate and a higher value corresponding to a higher ramp rate.

Thus, synchronization effects that can plague certain load control schemes can be avoided with PEM control schemes of the present disclosure. As illustrated in FIGS. 7A-7C and described above, one technique for preventing synchronization after a long shortage period is to incorporate a low-pass filter that modifies a utility reference signal r(t) with a reference filter 244 to limit the rate of increase of the reference signal. Coordinators made in accordance with the present disclosure may be configured with a variety of other mechanisms for maintaining randomization of DERs. For example, Coordinator 110 may be configured to send instructions to one or more DERs 102 to modify a PEM control parameter of the DER to prevent synchronization. For example, a coordinator 110 may send instructions to one or more DERs 102 to vary one or more of the control epoch length 224, communication epoch length 222, a minimum off time between control epochs, or the opt-in value for a locally-sensed condition (e.g., the temperature or charge where a DER that has opted out of PEM because it has dropped below a QoS threshold opts back in to PEM). In some examples, coordinator 110 may be configured with a random number generator that generates a random number for one or more of the preceding PEM control parameters, for example, within an upper and lower limit for each type of control parameter, and those parameters can be randomly assigned to the DERs, resulting in a further randomization of the DER PEM behavior.

Control of Bi-Directional Resources

In another aspect of the present disclosure, the bi-directional control of a DESS is enabled using, e.g., two different probabilistic automatons. Bi-directional resources like DESSs improve the ability of a coordinator to ramp down (via discharging). TCLs, by contrast are typically not controllable to the same extent as they can only be controlled to go down by rejecting requests. For example, if a coordinator declines a TCL packet request, the TCL doesn't ramp up but the coordinator cannot control the rate of ramping down without having a delay in response. If the coordinator accepts a TCL packet request, the TCL ramps up and the coordinator can control the rate of ramping up in a variety of ways described herein, e.g., by saying "YES" to every request (assuming sufficient requests are incoming) thereby controlling the rate of ramping up with rate of acceptance. By contrast, a coordinator can accept a DESS discharging request, resulting in a ramp down and the coordinator can control the rate of ramping down with rate of accepting discharging requests. Further, a coordinator can accept a DESS charging request resulting in a ramp up and the coordinator can control the rate of ramping up with the rate of accepting charging requests.

Thus, incorporation of PEM-controlled energy storage devices improves a coordinator's ability to ramp down a fleet of DERs. As such, PEM of a fleet of DERs can improve with more heterogeneous loads—control improves under a diversity of loads. In an exemplary embodiment described below, electric battery storage is considered, however, the scope of the disclosure is not limited to electric battery storage. Other examples of DESS include any of a variety of other storage types such as, for example, mechanical storage (e.g., pneumatic and hydraulic pump storage), electrical-chemical storage processes (e.g., electrolysis/fuel cell operation), etc. and any combination of different storage types. Similarly, language used throughout the present disclosure uses the vernacular of a battery storage system (e.g., "State of Charge") for convenience only, and the disclosure should not be limited to embodiments using only battery storage systems.

Figure 8:
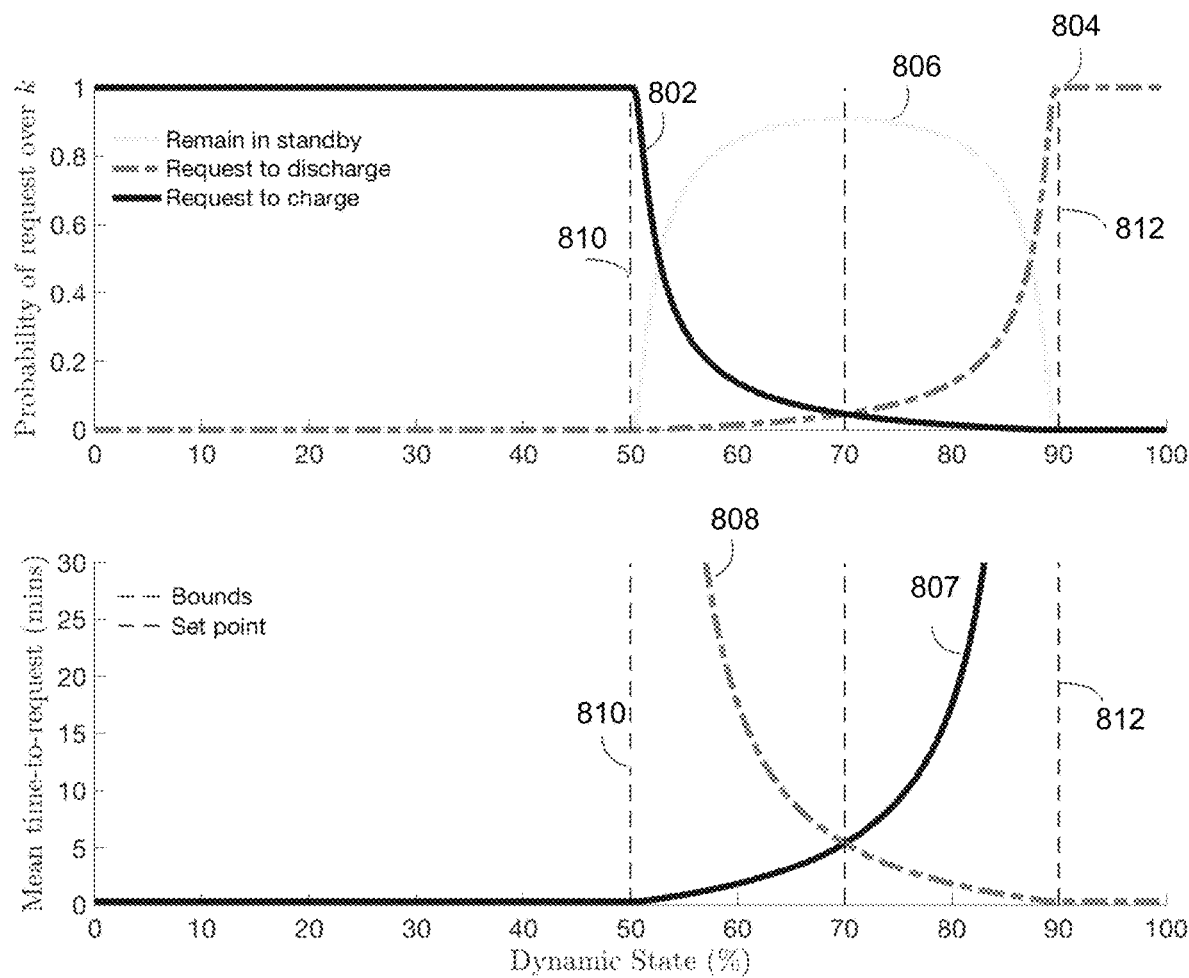
FIG. 8 shows charge and discharge probability profiles for a distributed energy storage system (DESS)

FIG. 8 top shows an example charge request probability profile 802 and an example discharge request probability profile 804 that one or more DESSs may be configured to use. Charge and discharge profiles 802, 804 define a request probability as a function of the DESS's dynamic state, for example, the DESS's state of charge in the case of a battery storage system. FIG. 8 also shows an example idle or stand-by probability profile 806 that illustrates a probability that a DESS configured to operate under both profiles 802, 804, may either decide to both request a charge and discharge or decide to not request either a charge or discharge, in both cases the DESS may not send any request to a coordinator during the corresponding communication epoch. In one example, a DESS configured to execute both profiles 802 and 804 may be configured to only make a request when one of its automatons determines a request should be made. The lower graph in FIG. 8 illustrates a mean time to request a charge curve 807 and a mean time to request a discharge curve 808, each as a function of a DESS's dynamic state (e.g., state of charge in a battery storage system).

In one example, a DESS may include a first automaton that determines a probability that the DESS will request an energy packet from the grid (i.e., a "charge")—similar to other PEM methods disclosed herein. A second automaton determines the probability that the DESS will request to provide an energy packet to the grid (i.e., a "discharge"). In the case of a battery, in one example, the probabilities are defined as a function of the state of charge (SOC) of the DESS. To ensure a minimum SOC is maintained, DESS may also be configured with a charge threshold (C_thresh) 810, below which the first automaton will always request an energy packet (i.e., probability is set to "1") or alternately may opt out and switch to a traditional charging method. Likewise, to allow excess DESS energy to be sell back to the grid, there may be a discharge threshold (D_thresh) 812, above which the second automaton's probability is set to "1." Between the two thresholds, the DESS can, at each communication epoch, request a charge, discharge, or standby (i.e., no request). In one example, the first and second automatons may operate independently, and if both a charge request and a discharge request are desired in the same epoch, the DESS will standby (i.e., neither request will be sent).

Referring again to FIG. 2, in some embodiments, one or more DERs 102 may be a DESS and may be operably coupled to a PEM controller 220 for PEM management in connection with coordinator 110. Sensor 216 may provide a current state of charge accessible by processor 218. Probability profiles 226 may include both charge and discharge probability profiles and processor 218 may be configured to execute PEM application 228 which may access one or both probability profiles for determining whether to make a request during a given communication epoch. The charge probability profile is a charge request probability (i.e., the probability that the DER will request a charge in the communication epoch. The discharge probability profile is a discharge request probability (i.e., the probability that the DER will request to discharge in a communication epoch. The discharge request probability may approach 1 as the DER's locally-sensed condition (e.g. state of charge) increases to a discharge threshold (D_thresh). The charge request probability may approach 1 as the DER's locally-sensed condition decreases to a charge threshold (C_thresh). The charge threshold is less than the discharge threshold (C_thresh<D_thresh). DER 102 may make a charge request based on the charge request probability and the state of charge condition and may be further configured to create a discharge request based on the discharge request probability and the state of charge condition. In some embodiments, when the charge request probability and the discharge request probability are such that both a charge request and a discharge request would be sent, the DER may be configured to send neither a charge request not a discharge request. In other words, the DER is configured such that neither a charge request nor a discharge request are created if the charge request probability and the discharge request probability would otherwise cause both to be created.

Processor 218 may be configured to determine a charge request probability for a communication epoch, wherein the charge request probability approaches 1 as the state of charge decreases to the charge threshold, C_thresh, and a discharge request probability approaches 1 as the state of charge increases to a discharge threshold, D_thresh, where C_thresh<D_thresh. The DER may be further configured to create a charge request with a determined probability (the charge request probability) based on the state of charge condition and create a discharge request with a different determined probability (the discharge request probability) based on the state of charge condition. If the charge and discharge automatons either both create a request or both do not create a request then no request is forwarded to the coordinator. If only one of the automatons creates a request then that request (charge or discharge) is forwarded to the coordinator.

Figure 9:
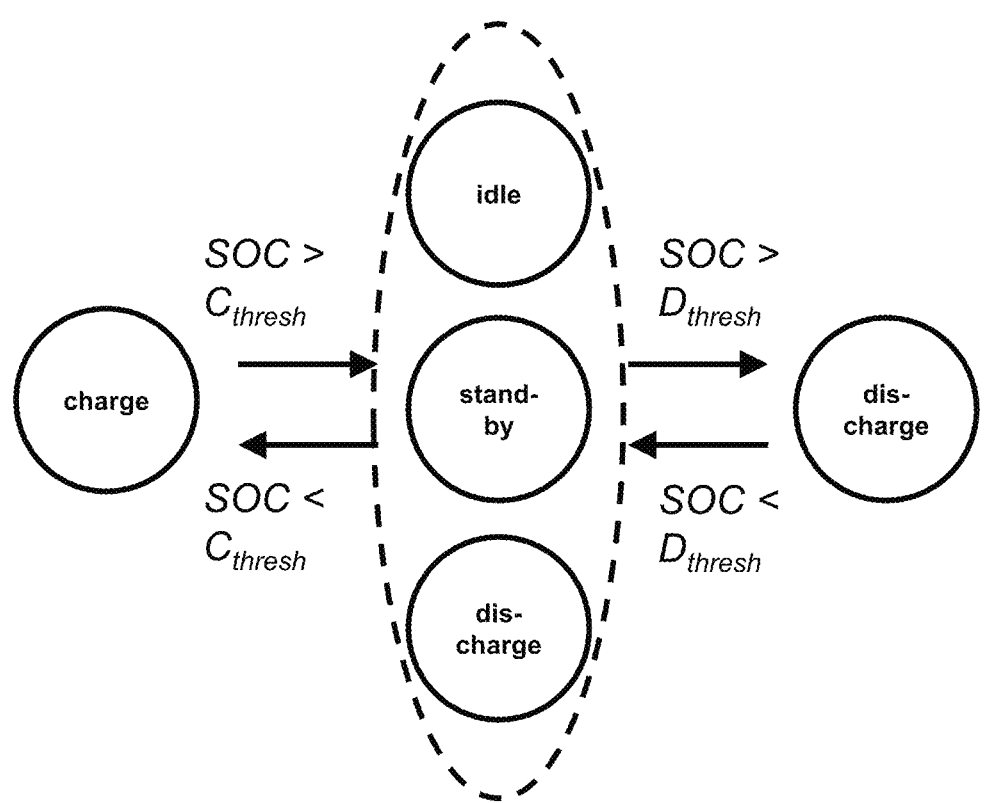
FIG. 9 is a state flow diagram of an example DESS.

FIG. 9 further illustrates various states of a DESS configured for PEM. Referring to FIGS. 8 and 9, in the illustrated example, if a DESS's SOC is below C_thresh, e.g., 0.5, the DESS will request charge with probability 1 and will not request a discharge. If the DESS's SOC is above 0.5, it will independently request a charge according to charge request probability profile 802 and request a discharge according to discharge probability profile 804. If both actions are 'true' then the DESS will "hold" (i.e., standby and issue neither request).

Figure 10:
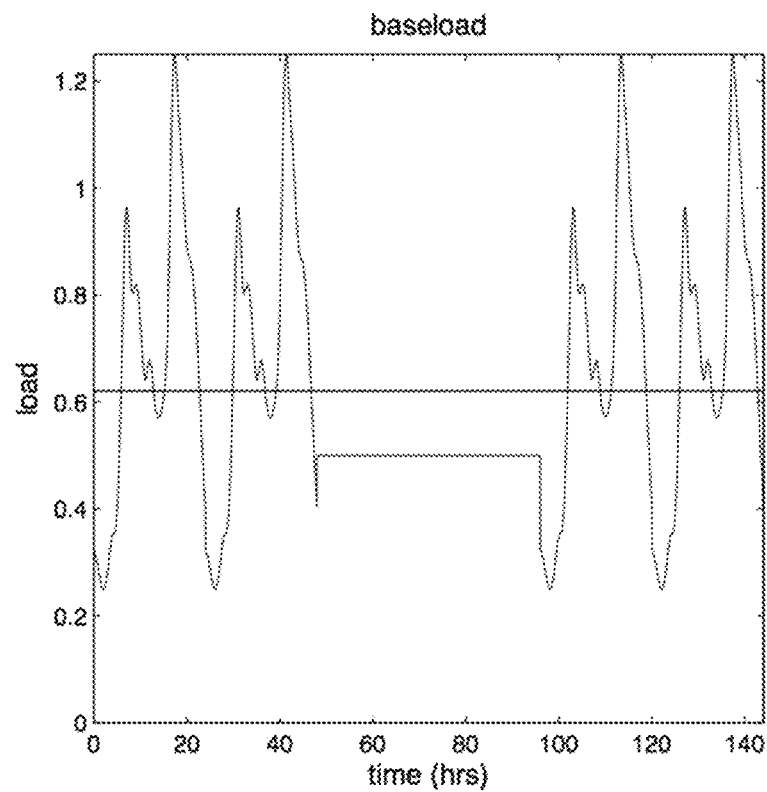
FIG. 10 shows an external variable load in a simulation.
Figure 11:
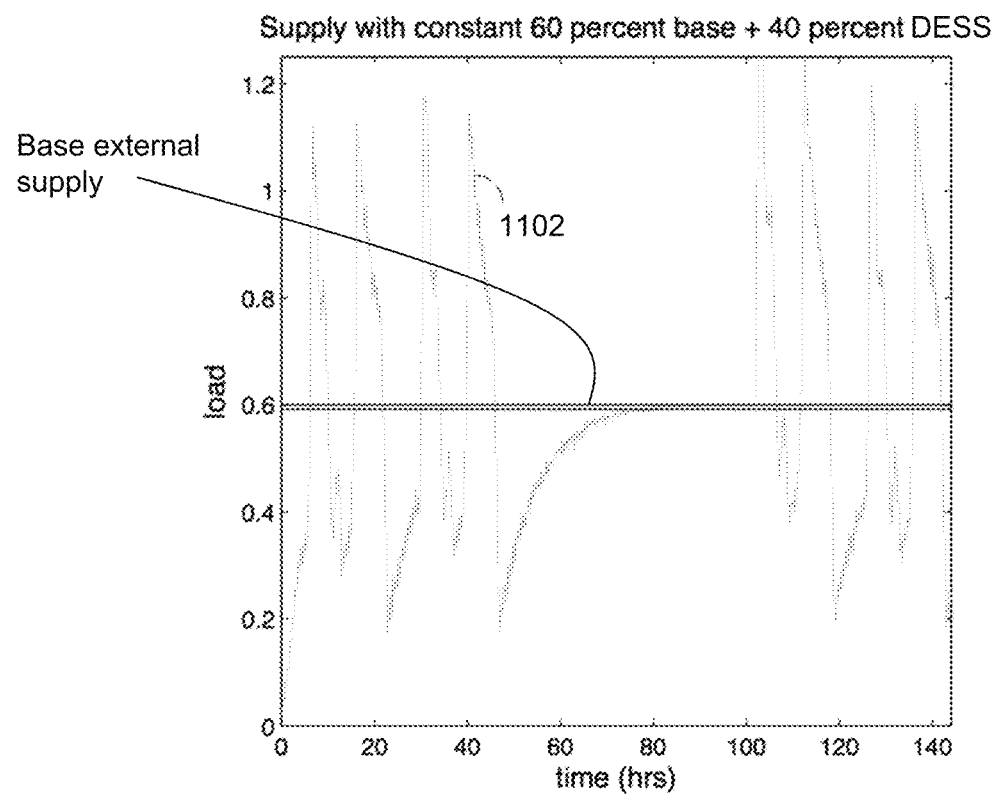
FIG. 11 shows the supply with constant 60 percent base+40 percent DESS for the simulation of FIG. 10.

To illustrate a bi-directional DESS embodiment, a simulation was conducted for 1000 DESSs over a simulated timeframe of six days. Over the course of six days, the system sees the 'external' variable load illustrated in FIG. 10. Note that the load extends beyond 1.0 at its peaks indicating that energy from the DESSs will be needed to meet the load. The load profile for days 1, 2, 5, and 6 are based on residential data. The load profile for days 3 and 4 are set artificially low to illustrate how excess supply can be used to bring the DESSs up to full SOC. The base external supply is assumed to be constant at 60% of a 1.0 load (see FIG. 11). FIG. 11 also shows net supply 1102 to the system at each communication epoch from the DESSs. This does not match the external load exactly for there is additional load in charging DESSs (i.e., agents) with low SOC.

Figure 12:
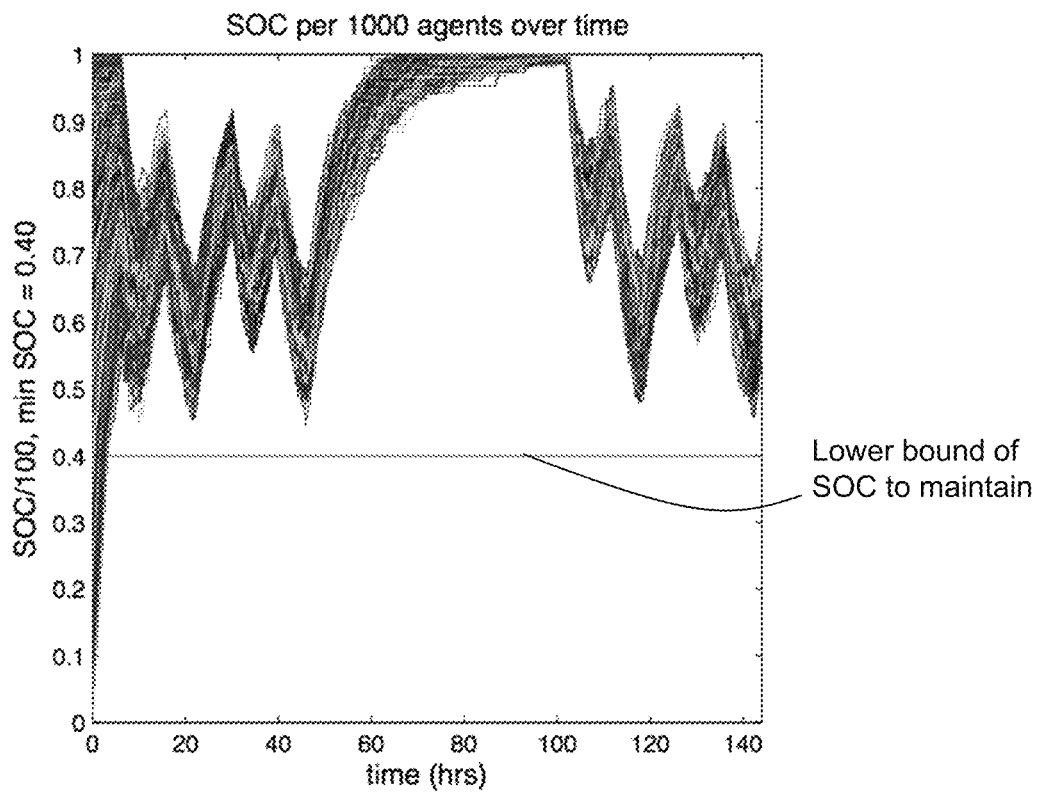
FIG. 12 shows the state of charge (SOC) per 1000 agents over time for the simulation of FIG. 10.

1000 DESS agents were utilized with control automatons configured with a minimum charge threshold, C_thresh, of 0.4, meaning they were configured to ensure at least 0.4 SOC was maintained (see FIG. 12). In one example, C_thresh is an end-user defined parameter related to an end user's desired quality of service. Note that C_thresh could be arbitrarily set and does not need to be the same across all DESS agents. SOC for the 1000 DESSs were randomly assigned (0 to 1) at the beginning of the simulation.

Figure 13:
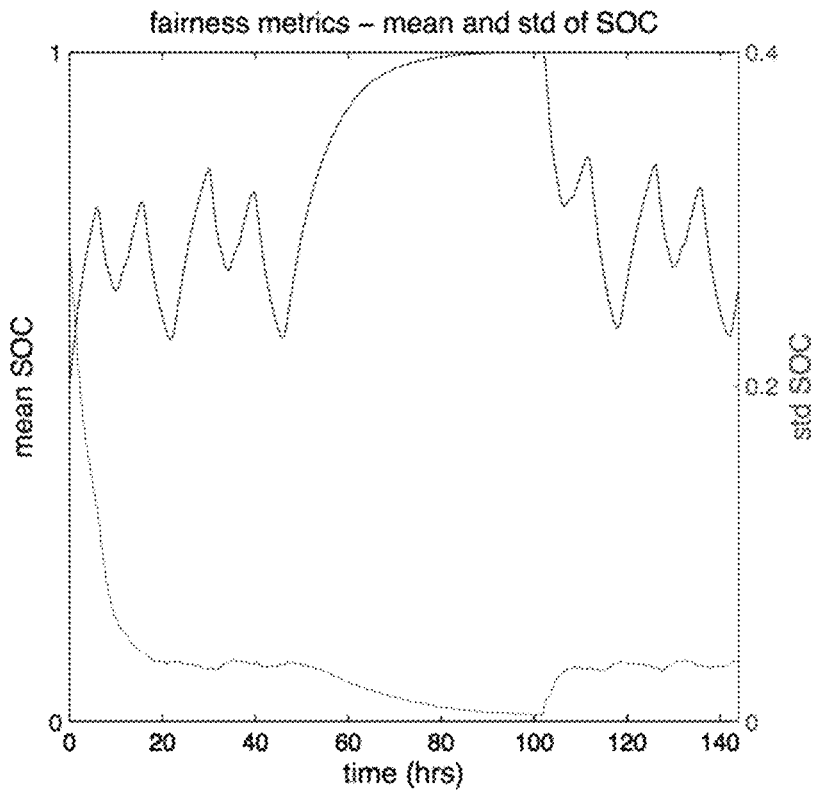
FIG. 13 shows fairness metrics (mean and standard deviation of SOC) for the simulation of FIG. 10.
Figure 14:
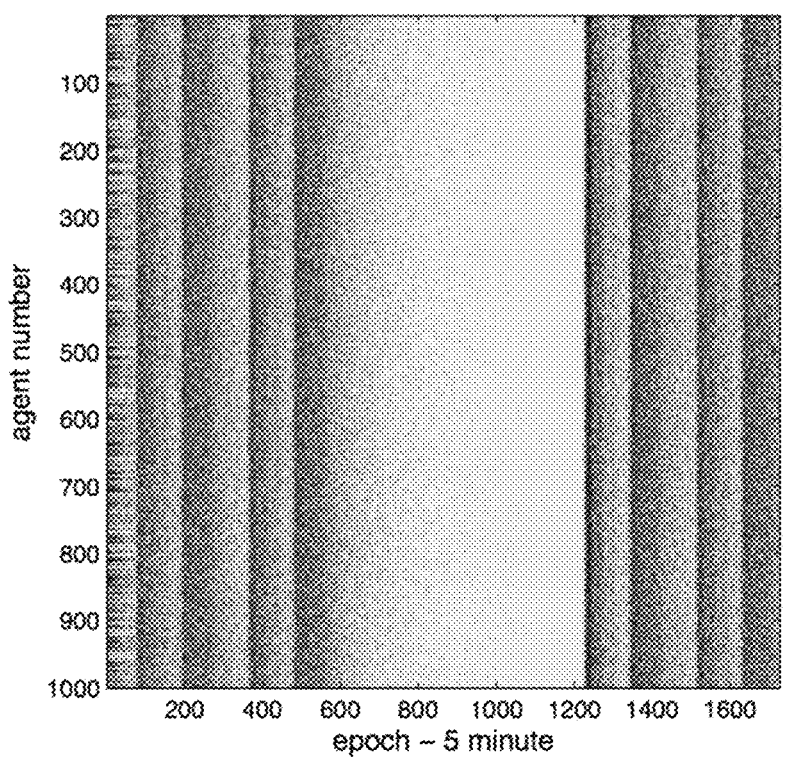
FIG. 14 shows transactions at each epoch for the simulation of FIG. 10.
Figure 15:
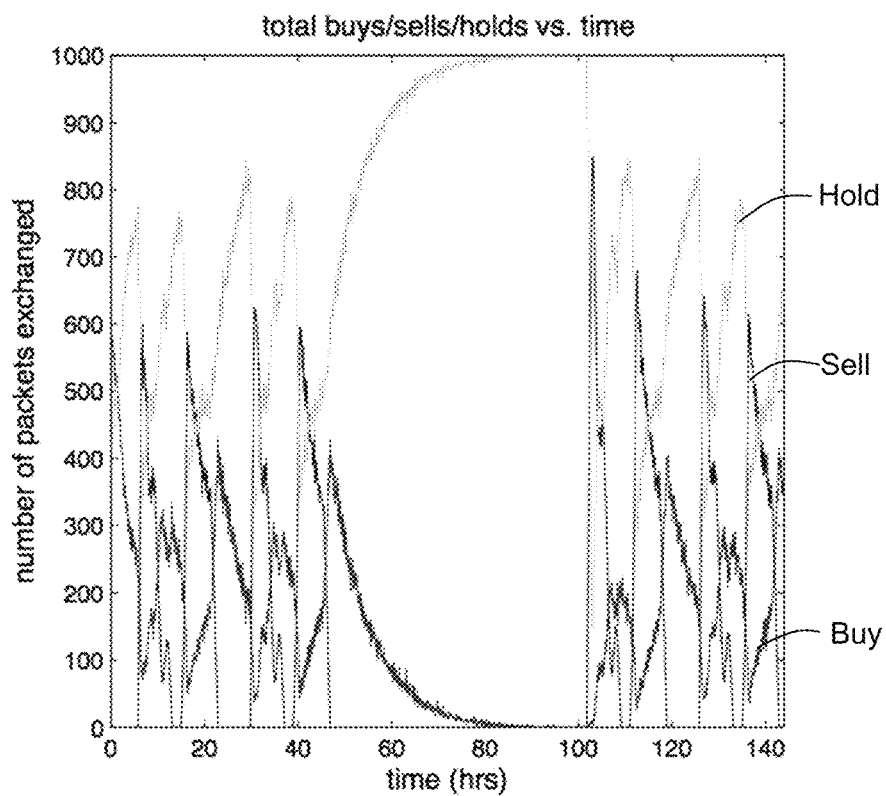
FIG. 15 total buys, sells, and holds over time for the simulation of FIG. 10.

At each communication epoch, a DESS agent charged (dark gray), discharged (medium gray), or held (light gray) as seen in FIG. 14. The total buys/sells/holds are shown in FIG. 15 and their sum equals the number of agents (1000). More dynamics in the load (FIG. 10) leads to more dynamics and disparity in the DESS agent's SOC (FIGS. 12 and 13).

Example of a Coordinator Operating with Both Homogeneous and Heterogeneous Loads.

The following describes and illustrates an example of a single coordinator controlling a diverse fleet of heterogeneous DERs. Specifically, the following case-study illustrates how 1500 heterogeneous packetized DERS—TCL (1000), PEV (250), and ESS (250)—can all be coordinated under with single coordinator and simultaneously track a reference signal (in the aggregate) and satisfy (local) QoS constraints.

The uncontrollable background demand for each load type describes the random perturbations to the local dynamic state. TCL: for the 1000 residential electric water heaters, the uncontrollable demand represents the use of hot-water in the home, such as a shower and running the washing machine or dishwasher. For this numerical example, models were developed based on statistics found in the literature for the energy use patterns of electric water heaters. PEV: the background demand in the case of the 250 plug-in electric vehicle batteries represent the driving patterns that discharge the battery. The PEV travel patterns were randomly sampled from travel survey data for New England, which provides the stochastic model for residential arrival and departure times, as well as miles driven. From an assumed electric driving range of 150 miles and an electric driving efficiency of 6.7 miles-per-kWh, the total reduction in SOC is computed upon arriving home (to charge). ESS: the 250 home batteries were based on specifications representative of a large battery manufacturers residential energy storage units typical of a large battery manufacturer, which each have a battery capacity of 13.5 kWh, charge and discharge efficiency of around 95% (roundtrip of 92%), and a maximum (continuous) power rating of 5.0 kW. It was assumed that the battery owner stochastically charges or discharges the battery based on a Gaussian random walk with a minimum power draw of 1.5 kW in either direction. This could be representative of excess or deficit residential solar PV production or short-term islanding conditions.

Figure 16:
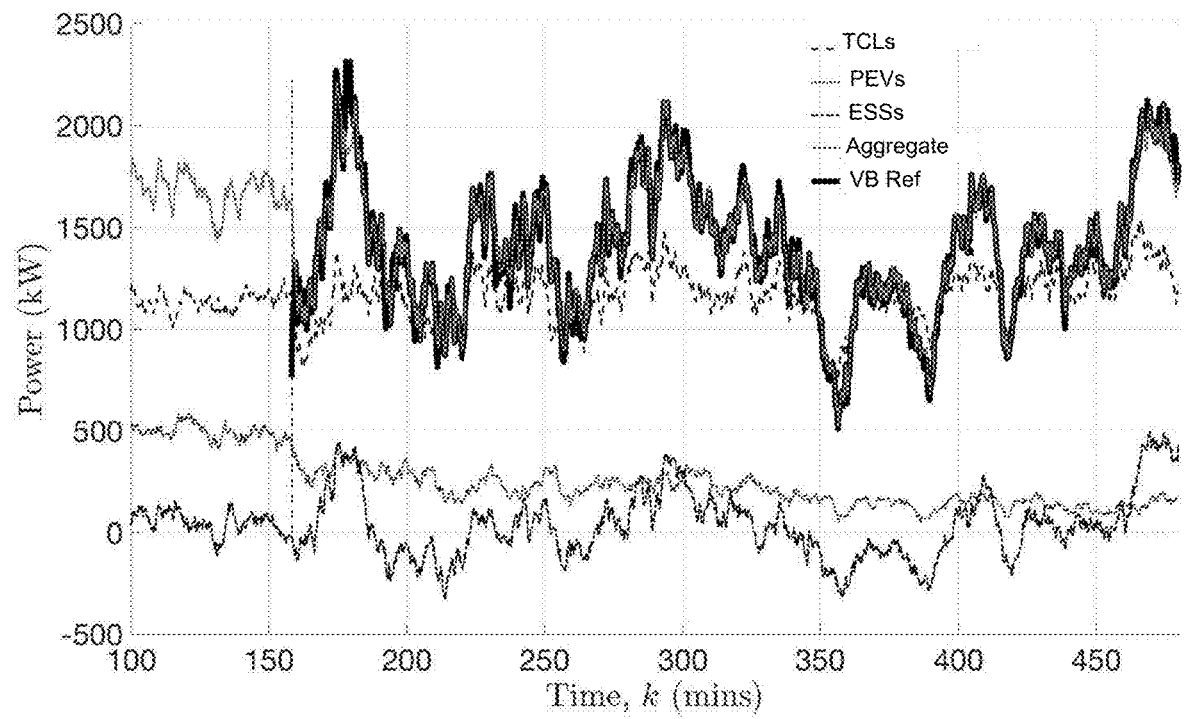
FIG. 16 is a graph showing the independent and managed behavior of a coordinator over 8 hours (480 minutes) that consists of three different load types: 1000 electric water heaters, 250 electric vehicle chargers, and 250 electric battery storage systems. The signal to be tracked by the coordinator turns on at 160 minutes. Coordinator response is shown to track signal well as loads are being managed using the packetized energy management approach.

The N=1500 diverse DER devices are then packetized and, over an 8-hour period (16:00 to 24:00), the coordinator will interact with the loads and from 18:40 to 24:00 the coordinator tracks a mean-reverting random signal that represents a balancing signal from the ISO. The tracking is achieved by denying or accepting packet requests based on real-time error between reference and aggregated coordinator power output as described earlier. The tracking errors are less than 5% for packet epochs of 6=5 minutes. FIG. 16 illustrates the tracking performance of the coordinator and that QOS requirements are satisfied as well.

Figure 17:
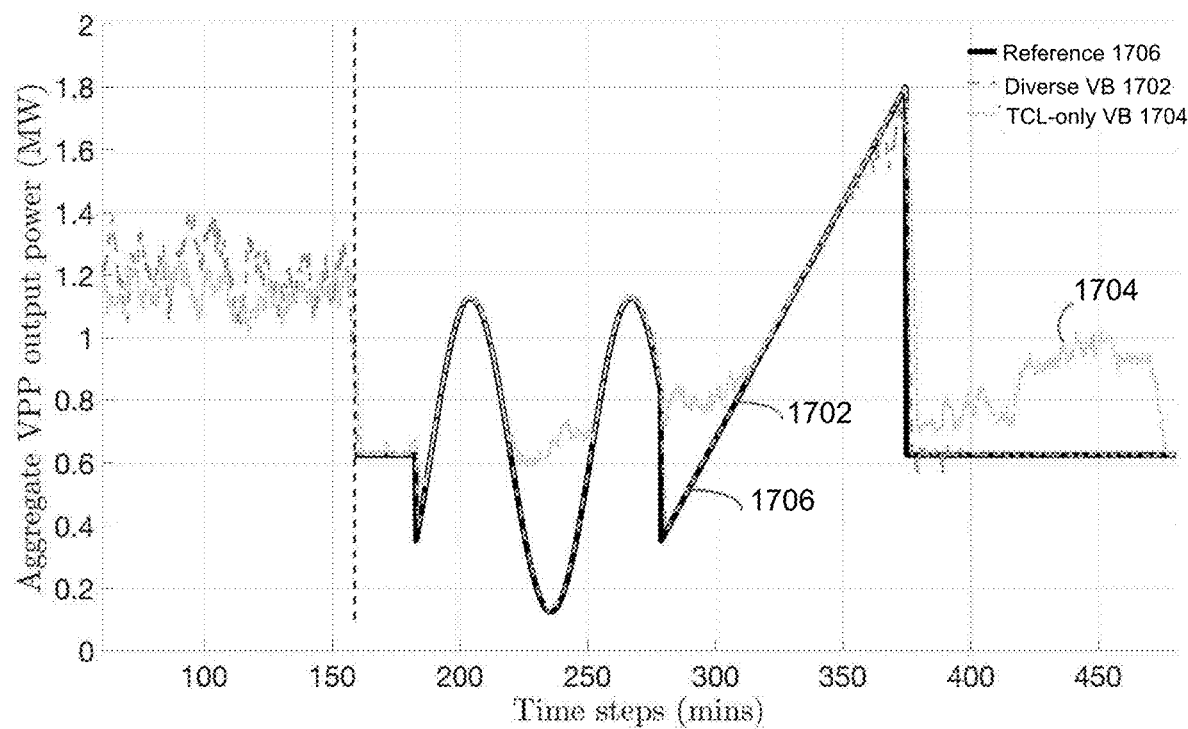
FIG. 17 shows two coordinators that are tracking a multi-mode reference signal with different sets of DERs. The diverse coordinator (with 1000 TCLs, 250 PEVs, and 250 ESS batteries) significantly outperforms the 1000 TCL-only coordinators by leveraging the bidirectional capability of the batteries while maintaining QOS across all DER types. The TCL-only coordinators is unable to track due to large number of TCLs that enter exit-ON and opt out of PEM.
Figure 18A:
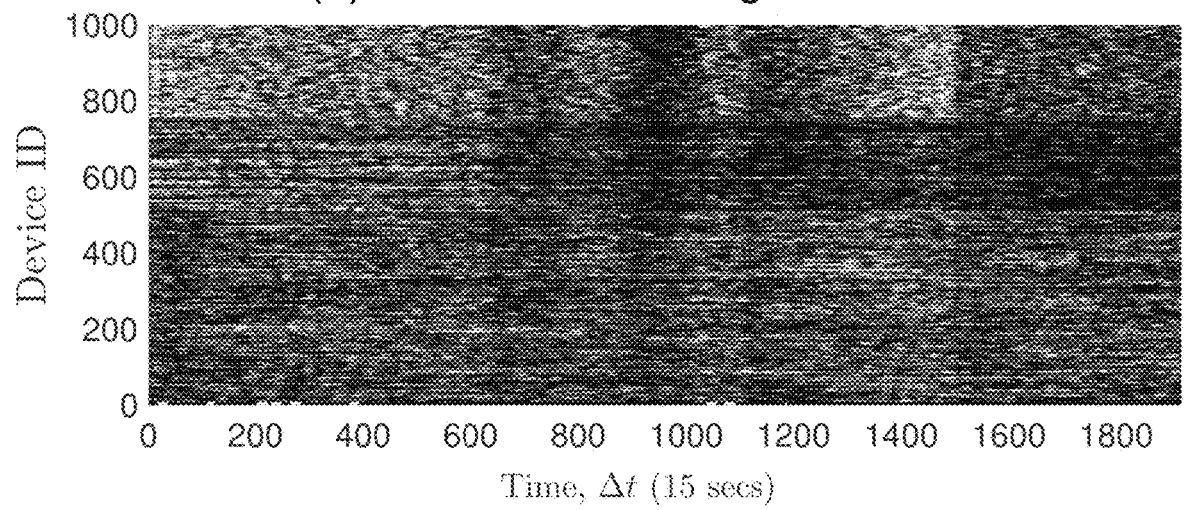
FIG. 18A shows the packetization effect for the diverse network of FIG. 17.
Figure 18B:
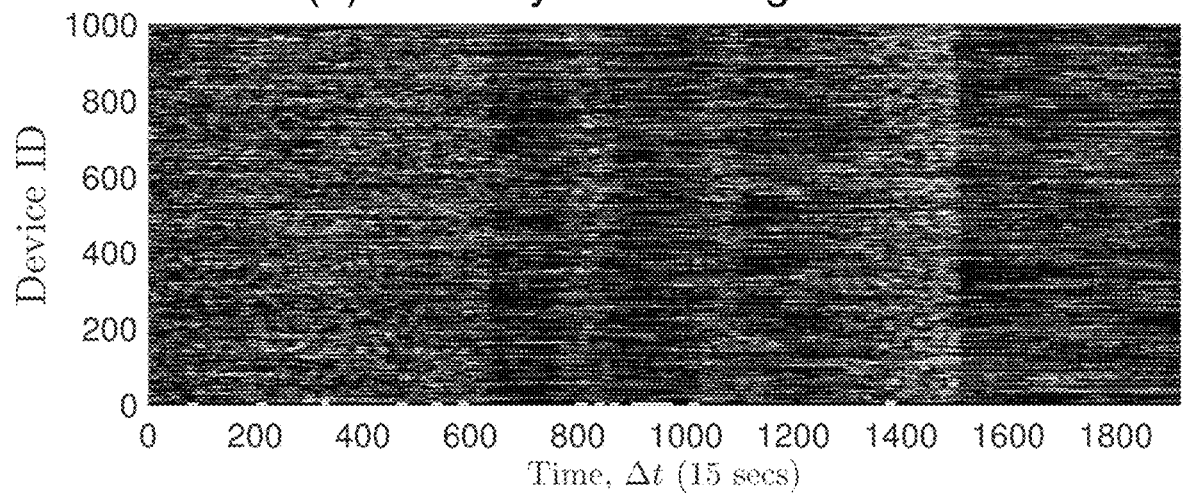
FIG. 18B shows the packetization effect for the uniform network 1500 electric water heaters of FIG. 17.

Referring to FIG. 17, consider two coordinators: one is comprised of 1000 TCLs, 250 PEVs, and 250 ESS batteries, a diverse coordinator 1702 while the other contains 1500 TCLs—TCL-only coordinator 1504. FIG. 17 illustrates how these two coordinators perform in tracking a reference signal 1706 (which for ease of comparison would correspond to signal r(t) in FIGS. 6A-6C) composed of step, periodic, and ramp changes. FIG. 17 shows the diverse coordinator 1702 outperforms the TCL-only coordinator 1704. More specifically, the root mean square tracking error for the diverse coordinator 1702 is four times smaller than the TCL-only coordinator 1594 (54 kW vs. 220 kW). Also, the gain in performance comes without sacrificing QoS as the TCLs in both coordinators 1702, 1704, experience nearly identical mean absolute deviation from the temperature set-point: 2.4.degree. C. vs. 2.5.degree. C. (with similar standard deviations). To further illustrate the value of a diverse fleet of resources, FIGS. 18A and 18B provide the ON/OFF statuses for each device in the respective coordinators. Careful comparison of the coordinator illustrate that the TCL-only coordinator fails to track the lower parts of the reference signal due to many TCLs opting out (i.e., transitions to exit-ON) as signified by very long continuous ON periods for the TCL-only coordinator in FIGS. 18A and 18B. That is, diversity in distributed energy resources not only improves tracking ability, but also improves QoS delivered to end-consumer.

Figure 19:
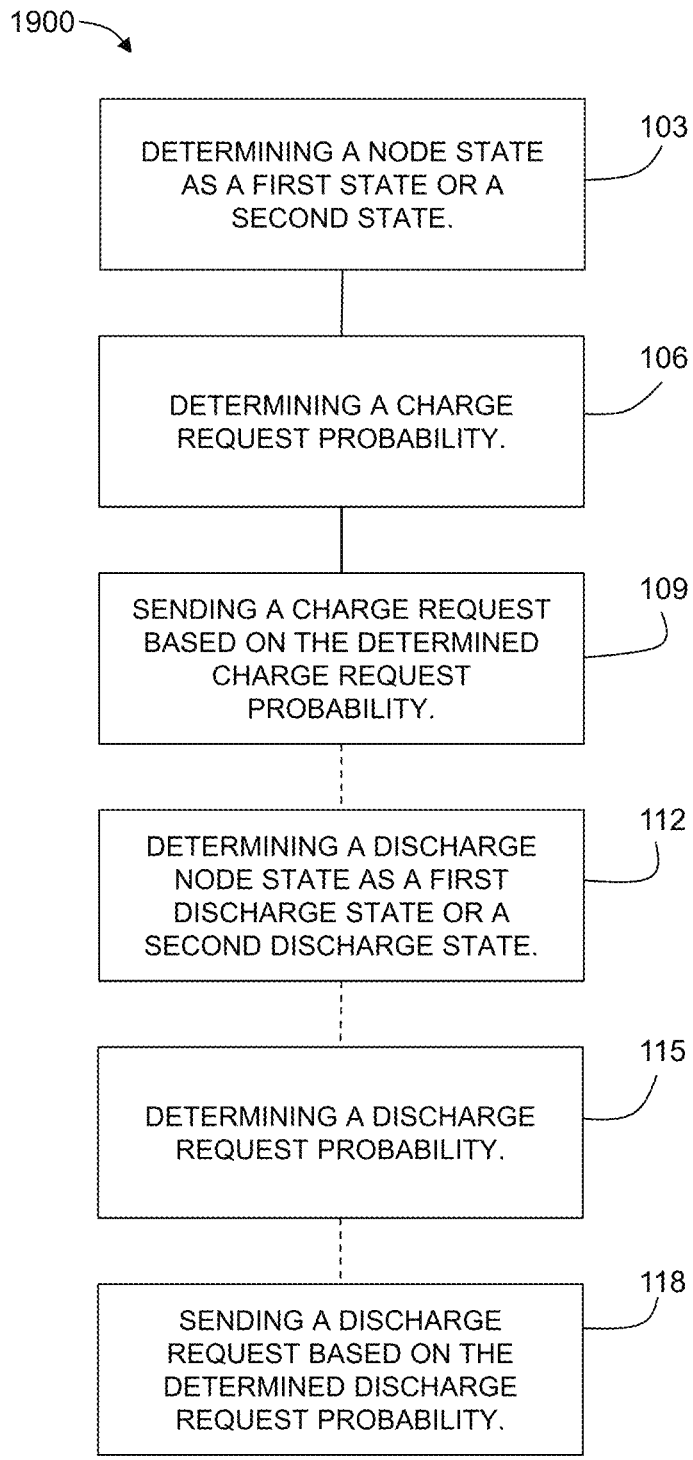
FIG. 19 illustrates a method of the present disclosure.

FIG. 19 illustrates an example method 1900 for requesting electrical power during a communication epoch. The method 1900 includes determining 103 a DER state as a first state, with a first request probability, or a second state, with a second request probability. In another example, determining 103 may include selecting a charge request probability profile. A charge request probability for the communication epoch is determined 106. The determined 106 charge request probability corresponds to the determined 103 DER state (or in some examples, a probability profile) and in some examples, may also be a function of a DER condition, e.g., a locally sensed condition (both as described above and further described below). A charge request may be sent 109 based on the determined 106 charge request probability.

In some embodiments, the method 1900 may be performed on a DER that is a DESS. As such, the method 1900 may also include assessing a state of charge as the DER locally sensed condition. The method 1900 may further comprise determining 112 a discharge DER state as a first discharge state, with a first discharge probability, or a second discharge state, with a second discharge probability. In another example, the determining step 112 may include determining or selecting a discharge request probability profile. A discharge request probability may be determined 115 for a communication epoch, corresponding in one example to the determined 112 discharge DER state and the DER locally sensed condition or in some examples, a probability determined from a selected probability profile and locally sensed condition (e.g., SOC). A discharge request may be sent 118 based on the discharge request probability. In some embodiments, the charge request probability approaches 1 as the state of charge decreases to a charge threshold, C_thresh, and the discharge request probability approaches 1 as the state of charge increases to a discharge threshold, D_thresh, where C_thresh<D_thresh. In some embodiments, no charge request or discharge request is sent if the request probability and discharge request probability would otherwise cause both a charge request and a discharge request to be sent. For example, steps 103-109 and steps 112-118 may be performed in parallel and a decision made as to whether or not to make either a charge or discharge request or to stand-by as described herein.

Any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 20:
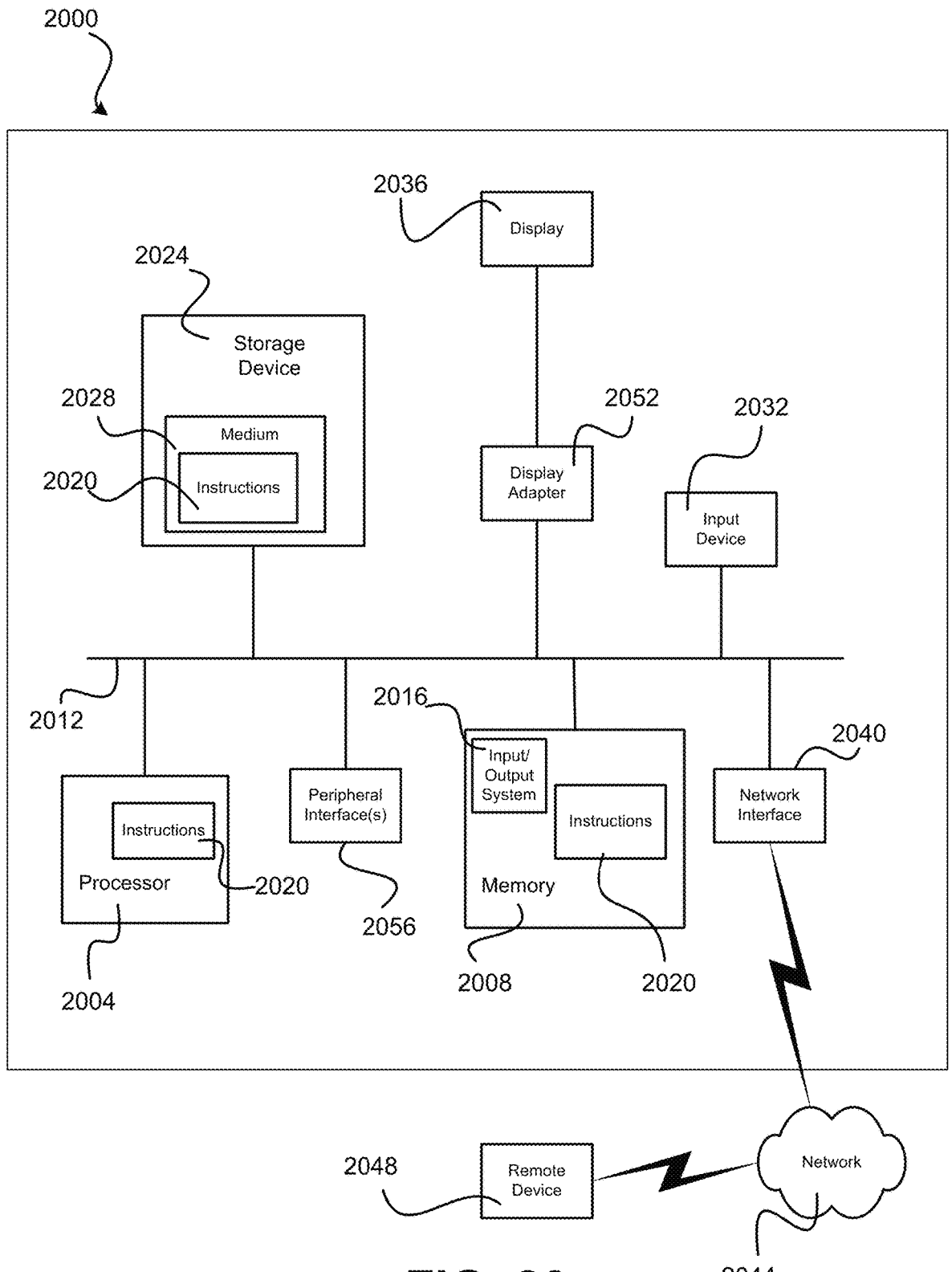
FIG. 20 illustrates an example computer system that may be used to implement one or more aspects of the present disclosure.

FIG. 20 shows a diagrammatic representation of one embodiment of a computing device in the exemplary form of a computer system 2000 within which a set of instructions for causing a control system, such as the DER management system 308 of FIG. 3, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 2000 includes a processor 2004 and a memory 2008 that communicate with each other, and with other components, via a bus 2012. Bus 2012 may include any of several types of bus structures including, but not limited to, a memory bus, a memory controller, a peripheral bus, a local bus, and any combinations thereof, using any of a variety of bus architectures.

Memory 2008 may include various components (e.g., machine-readable media) including, but not limited to, a random access memory component, a read only component, and any combinations thereof. In one example, a basic input/output system 2016 (BIOS), including basic routines that help to transfer information between elements within computer system 2000, such as during start-up, may be stored in memory 2008. Memory 2008 may also include (e.g., stored on one or more machine-readable media) instructions (e.g., software) 2020 embodying any one or more of the aspects and/or methodologies of the present disclosure. In another example, memory 2008 may further include any number of program modules including, but not limited to, an operating system, one or more application programs, other program modules, program data, and any combinations thereof.

Computer system 2000 may also include a storage device 2024. Examples of a storage device (e.g., storage device 2024) include, but are not limited to, a hard disk drive, a magnetic disk drive, an optical disc drive in combination with an optical medium, a solid-state memory device, and any combinations thereof. Storage device 2024 may be connected to bus 2012 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 2024 (or one or more components thereof) may be removably interfaced with computer system 2000 (e.g., via an external port connector (not shown)). Particularly, storage device 2024 and an associated machine-readable medium 2028 may provide nonvolatile and/or volatile storage of machine-readable instructions, data structures, program modules, and/or other data for computer system 2000. In one example, software 2020 may reside, completely or partially, within machine-readable medium 2028. In another example, software 2020 may reside, completely or partially, within processor 2004.

Computer system 2000 may also include an input device 2032. In one example, a user of computer system 2000 may enter commands and/or other information into computer system 2000 via input device 2032. Examples of an input device 2032 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 2032 may be interfaced to bus 2012 via any of a variety of interfaces (not shown) including, but not limited to, a serial interface, a parallel interface, a game port, a USB interface, a FIREWIRE interface, a direct interface to bus 2012, and any combinations thereof. Input device 2032 may include a touch screen interface that may be a part of or separate from display 2036, discussed further below. Input device 2032 may be utilized as a user selection device for selecting one or more graphical representations in a graphical interface as described above.

A user may also input commands and/or other information to computer system 2000 via storage device 2024 (e.g., a removable disk drive, a flash drive, etc.) and/or network interface device 2040. A network interface device, such as network interface device 2040, may be utilized for connecting computer system 2000 to one or more of a variety of networks, such as network 2044, and one or more remote devices 2048 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 2044, may employ a wired and/or a wireless mode of communication. In general, any network topology may be used. Information (e.g., data, software 2020, etc.) may be communicated to and/or from computer system 2000 via network interface device 2040.

Computer system 2000 may further include a video display adapter 2052 for communicating a displayable image to a display device, such as display device 2036. Examples of a display device include, but are not limited to, a liquid crystal display (LCD), a cathode ray tube (CRT), a plasma display, a light emitting diode (LED) display, and any combinations thereof. Display adapter 2052 and display device 2036 may be utilized in combination with processor 2004 to provide graphical representations of aspects of the present disclosure. In addition to a display device, computer system 2000 may include one or more other peripheral output devices including, but not limited to, an audio speaker, a printer, and any combinations thereof. Such peripheral output devices may be connected to bus 2012 via a peripheral interface 2056. Examples of a peripheral interface include, but are not limited to, a serial port, a USB connection, a FIREWIRE connection, a parallel connection, and any combinations thereof.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

What is claimed is:

1. A method of providing ancillary services to a power grid with a packetized energy management (PEM) coordinator, the method comprising:
    receiving a reference signal from the power grid;
    receiving or determining an aggregate need for energy (NFE) of a plurality of distributed energy resources (DERs) in communication with the PEM coordinator;
    determining, according to the reference signal and the NFE, whether to grant or deny permission to one or more of the plurality of DERs to draw packets of power from or discharge packets of power to the power grid; and
    granting or denying permission to the DERs to draw or discharge power packets;
    wherein the plurality of DERs are located in a plurality of geographic regions of the power grid, wherein the receiving or determining the NFE includes receiving or determining an NFE for each geographic region of DERs and the receiving a reference signal includes receiving a reference signal for each geographic region.

2. The method of claim 1, further comprising filtering the reference signal, wherein the filtering includes applying at least one of a low-pass filter to the reference signal so that a rate of change of the filtered reference signal is less than a rate of change of the reference signal or a high-pass filter to the reference signal so that a rate of change of the filtered reference signal is greater than a rate of change of the reference signal.

3. The method of claim 1, further comprising applying a rate limit to the rate at which the requests to draw or discharge power are granted after a power shortage period to limit a rate of increase in power packet consumption by the DERs to prevent synchronization of the DERs.

4. The method of claim 1, further comprising filtering the reference signal, wherein the filtering includes receiving a directional prediction of the reference signal and selecting a filtered reference signal to optimize a tracking of the DER's net energy load to the directional prediction of the reference signal.

5. The method of claim 1,
    wherein the NFE is at least one of a measure of an aggregate amount of energy currently stored by the DERs and a prediction of a future need for energy by the DERs.

6. The method of claim 1, further comprising applying a finite impulse response filter to the reference signal.

7. The method of claim 1, wherein the DERs are configured to independently determine, according to a request probability profile, whether to request to draw packets of power from or discharge packets of power to the power grid.

8. The method of claim 1, further comprising randomizing a PEM control parameter to minimize synchronization of the drawing or discharging of power packets by the DERs.

9. The method of claim 8, wherein the PEM control parameter is at least one of a control epoch length, a communication epoch length, and a minimum off time between control epochs, the method further comprising transmitting the randomized PEM control parameter to the DERs.

10. The method of claim 8, wherein the PEM control parameter is a PEM opt-in value for a locally-sensed condition of the DER for opting-in to PEM control of the DER by the coordinator after the locally-sensed condition exceeds a quality of service bound.

11. A method of providing ancillary services to a power grid with a packetized energy management (PEM) coordinator, the method comprising:
accepting and denying requests to draw or discharge energy from a plurality of distributed energy resources (DERs) in communication with the coordinator;
determining, with a virtual battery model, an aggregate need for energy (NFE) of the plurality of DERs, wherein the NFE is estimated from the number and/or rate of requests received from the DERs to draw or discharge energy;
receiving, from a grid operator, a power grid reference signal; and
determining, from the NFE and the power grid reference signal, whether to grant or deny requests from the DERs to receive or discharge power packets.

12. The method of claim 11, wherein the NFE is at least one of a measure of an aggregate amount of energy currently stored by the DERs and a prediction of a future need for energy by the DERs.

13. The method of claim 11, wherein the power grid reference signal is at least one of an automatic generation control signal, a spinning reserves dispatch signal, or an inverse of wholesale energy prices.

14. The method of claim 11, further comprising:
receiving, from the grid operator, a directional prediction of the power grid reference signal;
determining, from the NFE and directional prediction, a packetized energy management (PEM) control signal; and
transmitting the PEM control signal to the plurality of DERs.

15. The method of claim 14, wherein the PEM control signal instructs the plurality of DERs to shift to a higher or lower request probability profile, the request probability profile defining a probability a corresponding DER will request a power packet during a communication epoch time interval.

16. The method of claim 15, wherein the request probability profile defines a probability a DER will request a power packet during a communication epoch time interval as a function of a locally-sensed condition of the DER.

17. The method of claim 16, wherein the locally-sensed condition is a temperature or state of charge of the DER.

18. The method of claim 14, wherein the PEM control signal instructs DERs with a locally-sensed condition that exceeds a threshold to transition to a standby mode and not request power packets.

19. The method of claim 11, wherein the plurality of DERs are located in a plurality of geographic regions of the power grid, wherein the determining the NFE includes determining an NFE for each geographic region of DERs and the receiving includes receiving a power grid reference signal for each geographic region.

20. A computing device, comprising:
a processor configured to perform a packetized energy management (PEM) application, the PEM application including instructions for causing the processor to:
receive a reference signal from a power grid;
filter the reference signal to create a filtered reference signal;
receive or determine an estimate of an aggregate energy state of a plurality of distributed energy resources (DERs) in communication with the computing device;
determine, according to the filtered reference signal and the estimated aggregate energy state, whether to grant or deny permission to one or more of the plurality of DERs to draw packets of power from or discharge packets of power to the power grid; and
grant or deny permission to the DERs to draw or discharge power packets;
wherein the plurality of DERs are located in a plurality of geographic regions of the power grid, wherein the receiving or determining the estimated aggregate energy state includes receiving or determining an estimated aggregate energy state for each geographic region of DERs and the receiving includes receiving a power grid reference signal for each geographic region.

21. The computing device of claim 20, wherein the filtering includes applying at least one of a low-pass filter to the reference signal so that a rate of change of the filtered reference signal is less than a rate of change of the reference signal or a high-pass filter to the reference signal so that a rate of change of the filtered reference signal is greater than a rate of change of the reference signal.

22. The computing device of claim 20, wherein the instructions further comprise an instruction to apply a rate limit to the rate at which the requests to draw or discharge power are granted after a power shortage period to limit a rate of increase in power packet consumption by the DERs to prevent synchronization of the DERs.

23. The computing device of claim 20, wherein the filtering includes receiving a directional prediction of the reference signal and selecting a filtered reference signal to optimize a tracking of the DER's net energy load to the directional prediction of the reference signal.

24. The computing device of claim 23,
wherein the aggregate energy state is at least one of a measure of an aggregate amount of energy currently stored by the DERs and a prediction of a future need for energy by the DERs.

25. The computing device of claim 20, wherein the filtering includes applying a finite impulse response filter.

26. The computing device of claim 20, wherein the DERs are configured to independently determine, according to a request probability profile, whether to request to draw packets of power from or discharge packets of power to the power grid.

27. A computing device, comprising:
a processor configured to perform a packetized energy management (PEM) application, the PEM application including instructions for causing the processor to:
accept and deny requests to draw or discharge energy from a plurality of distributed energy resources (DERs) in communication with the computing device;
determine, with a virtual battery model, an aggregate need for energy (NFE) of the plurality of DERs wherein the NFE is estimated from the number and/or rate of requests received from the DERs to draw or discharge energy;
receive, from a grid operator, a power grid reference signal; and
determine, from the NFE and the power grid reference signal, whether to grant or deny requests from the DERs to receive or discharge power packets.

28. The computing device of claim 27, wherein the NFE is at least one of a measure of an aggregate amount of energy currently stored by the DERs and a prediction of a future need for energy by the DERs.

29. The computing device of claim 27, wherein the power grid reference signal is at least one of an automatic generation control signal, a spinning reserves dispatch signal, or an inverse of wholesale energy prices.

30. The computing device of claim 27, the PEM application further including instructions for causing the processor to:
receive, from the grid operator, a directional prediction of the power grid reference signal;
determine, from the NFE and directional prediction, a packetized energy management (PEM) control signal; and
transmit the PEM control signal to the plurality of DERs.

31. The computing device of claim 30, wherein the PEM control signal instructs the plurality of DERs to shift to a higher or lower request probability profile, the request probability profile defining a probability a corresponding DER will request a power packet during a communication epoch time interval.

32. The computing device of claim 31, wherein the request probability profile defines a probability a DER will request a power packet during a communication epoch time interval as a function of a locally-sensed condition of the DER.

33. The computing device of claim 32, wherein the locally-sensed condition is a temperature or state of charge of the DER.

34. The computing device of claim 30, wherein the PEM control signal instructs DERs with a locally-sensed condition that exceeds a threshold to transition to a standby mode and not request power packets.

35. The computing device of claim 27, wherein the plurality of DERs are located in a plurality of geographic regions of the power grid, wherein the determining the NFE includes determining an NFE for each geographic region of DERs and the receiving includes receiving a power grid reference signal for each geographic region.

36. The method of claim 11, wherein the NFE is estimated from the number and/or rate of requests received from the DERs to draw or discharge energy and energy state information from one or more of the DERs, wherein the energy state information includes at least one of a locally-sensed condition, a target setpoint for the locally-sensed condition, historical usage data, a prediction of future usage of the DER, an amount of power being drawn or discharged by the DER, or a current or predicted future operating mode of the DER.

37. The method of claim 36, wherein the locally-sensed condition is one or more of temperature, state of charge, voltage, pressure, revolution rate, or a time-based deadline.

38. The method of claim 11, wherein the NFE is estimated from the number and/or rate of requests received from the DERs to draw or discharge energy but is not based on energy state information from specific DERs to thereby estimate the NFE of the plurality of DERs while maintaining the anonymity of the DERs.

* * * * *